United States Patent
Takemura

(10) Patent No.: US 9,571,099 B2
(45) Date of Patent: Feb. 14, 2017

(54) ELECTRONIC DEVICE COMPRISING MULTIPLEXER AND DRIVING METHOD THEREOF

(71) Applicant: Semiconductor Energy Laboratory Co., Ltd., Atsugi-shi, Kanagawa-ken (JP)

(72) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/145,967

(22) Filed: May 4, 2016

(65) Prior Publication Data

US 2016/0248425 A1    Aug. 25, 2016

Related U.S. Application Data

(63) Continuation of application No. 13/899,790, filed on May 22, 2013, now Pat. No. 9,337,836.

(30) Foreign Application Priority Data

May 25, 2012 (JP) .................. 2012-119633

(51) Int. Cl.
*H03K 19/00*    (2006.01)
*G11C 11/412*    (2006.01)
(Continued)

(52) U.S. Cl.
CPC ......... *H03K 19/0013* (2013.01); *G11C 11/412* (2013.01); *H01L 27/1104* (2013.01); *H03K 19/1737* (2013.01); *H03K 19/1776* (2013.01)

(58) Field of Classification Search
None
See application file for complete search history.

(56) References Cited

U.S. PATENT DOCUMENTS

| 4,609,986 A | 9/1986 | Hartmann et al. |
| 4,642,487 A | 2/1987 | Carter |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Alexander H Taningco
*Assistant Examiner* — Nelson Correa
(74) *Attorney, Agent, or Firm* — Fish & Richardson P.C.

(57) ABSTRACT

A method for driving a semiconductor device capable of reducing an area of a multiplexer and reducing its power consumption is provided. In a method for operating a semiconductor device including a memory and a multiplexer, a first transistor is connected to a first capacitor, and a second transistor is connected to a second capacitor. In the multiplexer, in a third transistor, a source is connected to a first input terminal and a drain is connected to an output terminal and, in a fourth transistor, a source is connected to a second input terminal and a drain is connected to the output terminal. Further, a step of holding a first potential in a node to which the first transistor, the first capacitor, and a gate of the third transistor are connected and holding a second potential higher than the first potential in the node is included.

14 Claims, 12 Drawing Sheets

(51) Int. Cl.
   *H01L 27/11* (2006.01)
   *H03K 19/173* (2006.01)
   *H03K 19/177* (2006.01)

(56) References Cited

U.S. PATENT DOCUMENTS

| | | | |
|---|---|---|---|
| 4,870,302 A | 9/1989 | Freeman | |
| 5,594,698 A | 1/1997 | Freeman | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,314,017 B1 | 11/2001 | Emori et al. | |
| 6,342,792 B1 * | 1/2002 | Huang | G06F 7/506 326/39 |
| 6,563,174 B2 | 5/2003 | Kawasaki et al. | |
| 6,727,522 B1 | 4/2004 | Kawasaki et al. | |
| 6,781,865 B2 | 8/2004 | Ohtsuka et al. | |
| 6,853,583 B2 | 2/2005 | Diorio et al. | |
| 7,030,650 B1 | 4/2006 | Kaptanoglu et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,515,490 B2 | 4/2009 | Lin et al. | |
| 7,674,650 B2 | 3/2010 | Akimoto et al. | |
| 7,732,819 B2 | 6/2010 | Akimoto et al. | |
| 7,893,718 B2 * | 2/2011 | Park | H03K 17/005 326/83 |
| 8,054,121 B2 | 11/2011 | Kato | |
| 8,305,815 B2 | 11/2012 | La Rosa | |
| 8,314,637 B2 | 11/2012 | Kato et al. | |
| 8,339,828 B2 | 12/2012 | Yamazaki et al. | |
| 8,339,836 B2 | 12/2012 | Yamazaki et al. | |
| 8,542,034 B2 * | 9/2013 | Kato | H03K 19/0013 326/104 |
| 8,830,733 B2 | 9/2014 | El Baraji et al. | |
| 8,970,251 B2 * | 3/2015 | Kurokawa | H03K 19/094 326/38 |
| 8,975,918 B2 * | 3/2015 | Takemura | H03K 19/1737 326/37 |
| 9,007,093 B2 * | 4/2015 | Kurokawa | H03K 19/177 326/38 |
| 9,117,501 B2 * | 8/2015 | Takemura | H03K 19/1737 |
| 9,337,836 B2 * | 5/2016 | Takemura | H03K 19/0013 |
| 2001/0046027 A1 | 11/2001 | Tai et al. | |
| 2002/0056838 A1 | 5/2002 | Ogawa | |
| 2002/0096702 A1 | 7/2002 | Ishii et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0237786 A1 | 10/2005 | Atwood et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0047286 A1 | 3/2007 | Miki | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0101351 A1 | 5/2011 | Yamazaki | |
| 2011/0121878 A1 | 5/2011 | Kato et al. | |
| 2011/0122673 A1 | 5/2011 | Kamata et al. | |
| 2011/0128777 A1 | 6/2011 | Yamazaki et al. | |
| 2011/0134683 A1 | 6/2011 | Yamazaki et al. | |
| 2011/0147737 A1 | 6/2011 | Yamazaki et al. | |
| 2011/0156025 A1 | 6/2011 | Shionoiri et al. | |
| 2011/0156027 A1 | 6/2011 | Yamazaki et al. | |
| 2011/0156028 A1 | 6/2011 | Yamazaki et al. | |
| 2011/0156117 A1 | 6/2011 | Yamazaki et al. | |
| 2011/0157961 A1 | 6/2011 | Yamazaki et al. | |
| 2011/0175083 A1 | 7/2011 | Sekine et al. | |
| 2011/0175087 A1 | 7/2011 | Yamazaki et al. | |
| 2011/0175104 A1 | 7/2011 | Yamazaki | |
| 2011/0175646 A1 | 7/2011 | Takemura et al. | |
| 2011/0176263 A1 | 7/2011 | Yamazaki et al. | |
| 2011/0176348 A1 | 7/2011 | Yamazaki et al. | |
| 2011/0176355 A1 | 7/2011 | Furutani et al. | |
| 2011/0176377 A1 | 7/2011 | Koyama | |
| 2011/0182110 A1 | 7/2011 | Yamazaki et al. | |
| 2011/0186837 A1 | 8/2011 | Takahashi et al. | |
| 2011/0187410 A1 | 8/2011 | Kato et al. | |

(56) References Cited

U.S. PATENT DOCUMENTS

| | | |
|---|---|---|
| 2011/0194327 A1 | 8/2011 | Kawae |
| 2011/0194332 A1 | 8/2011 | Saito |
| 2012/0293200 A1 | 11/2012 | Takemura |
| 2012/0293201 A1 | 11/2012 | Fujita et al. |
| 2012/0293202 A1 | 11/2012 | Nishijima et al. |
| 2012/0293203 A1 | 11/2012 | Ohmaru et al. |
| 2012/0293206 A1 | 11/2012 | Yoneda et al. |
| 2012/0293242 A1 | 11/2012 | Kato |
| 2012/0306533 A1 | 12/2012 | Ohmaru |
| 2013/0207170 A1 | 8/2013 | Kurokawa |
| 2013/0314123 A1 | 11/2013 | Takemura |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 209, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Ogranic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabalized Liquid Crystalline Blue Phases for Display Application". SID Digest '07 : SID International Symposium Digest of Technical Papers, 2007, vol. 28, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 :SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector with Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Phyicals Review B), Jan. 15, 2000, vol. 61, No. 3, pp. 1811-1816.

Osasa.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High Performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahasi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2009, vol. 85, No. 5, pp. 1012-1015.

\* cited by examiner

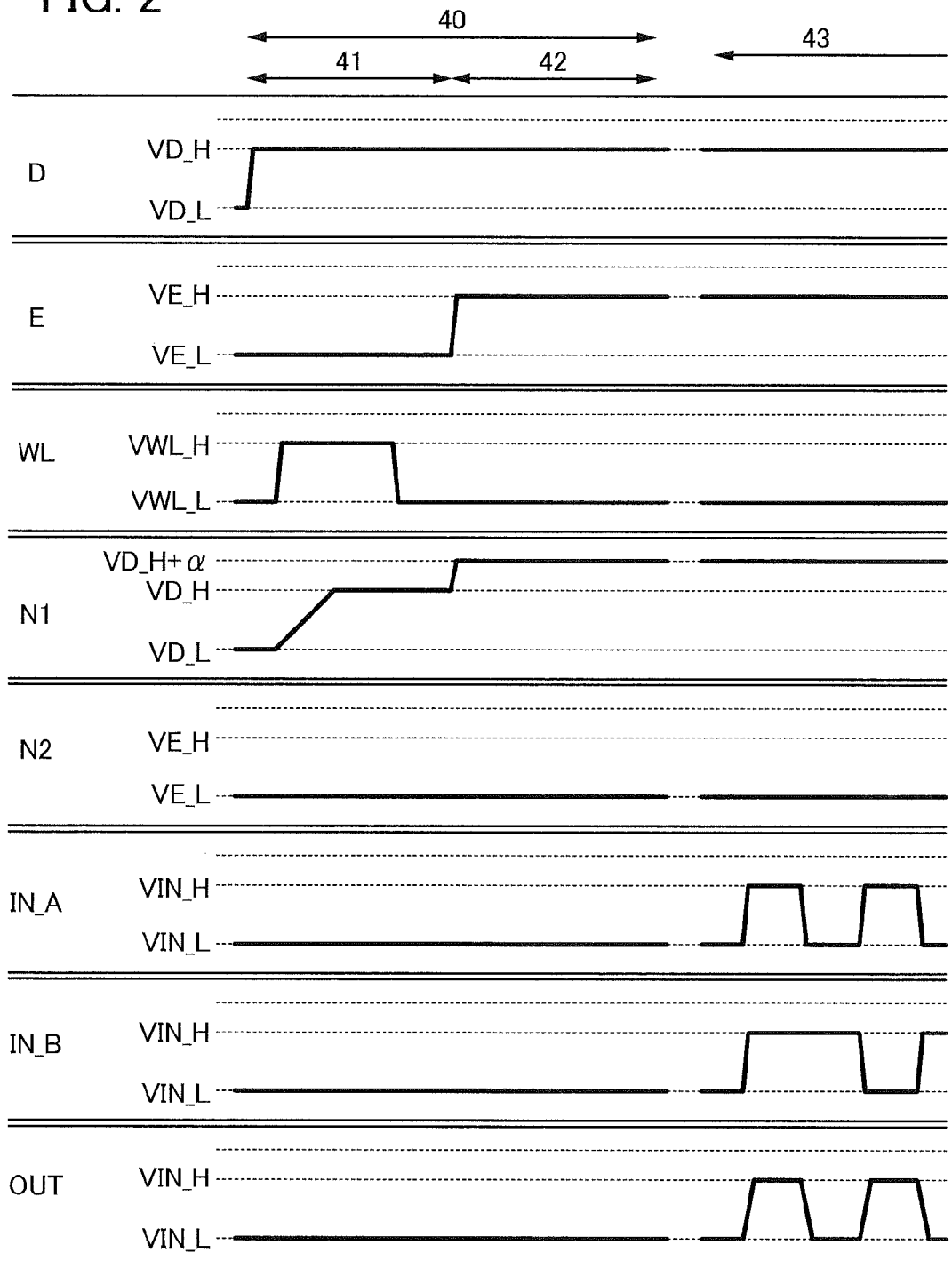

ELECTRONIC DEVICE COMPRISING MULTIPLEXER AND DRIVING METHOD THEREOF

CROSS-REFERENCE TO RELATED APPLICATIONS

This application is a continuation of U.S. application Ser. No. 13/899,790, filed May 22, 2013, now allowed, which claims the benefit of a foreign priority application filed in Japan as Serial No. 2012-119633 on May 25, 2012, both of which are incorporated by reference.

BACKGROUND OF THE INVENTION

1. Field of the Invention

The present invention relates to a method for driving a semiconductor device including a selection circuit and an electronic device including the semiconductor device.

2. Description of the Related Art

In an integrated circuit, a multiplexer is used as a selection circuit for selecting an input signal, for example. The multiplexer is a circuit for outputting one output signal from a plurality of input signals. Here, a reconfigurable logic circuit is described as an example of a semiconductor device including multiplexers.

The reconfigurable logic circuit includes a plurality of logic blocks each including a plurality of logic elements, a plurality of wirings for connecting the logic blocks, a programmable switch, and an input/output block.

The reconfigurable logic circuit can have a logical structure with a high degree of flexibility by changing the function of each logic element or connecting the logic blocks between the wirings. For example, in general, an output of a look-up table in a logic element is selected by a multiplexer to change the logic of the logic element. In that case, the multiplexer has not only a system in which its operation depends on a signal input from the outside but also a system in which its operation depends on data stored in a memory in advance. A circuit including such a memory and a multiplexer is referred to as a programmable multiplexer (see Patent Document 1).

Here, a typical multiplexer structure as disclosed in Patent Document 2 will be described. FIG. 12A shows a two-input and one-output multiplexer including a static random access memory (SRAM), a transistor T11, and a transistor T12. Each of the transistors T11 and T12 controls conduction between an input terminal and an output terminal and is also referred to as a transfer gate. In the transistor T11, one of a source and a drain is connected to an input terminal IN_A, the other of the source and the drain is connected to an output terminal OUT, and a gate is connected to a terminal D of the SRAM. In the transistor T12, one of a source and a drain is connected to an input terminal IN_B, the other of the source and the drain is connected to the output terminal OUT, and a gate is connected to a terminal DB of the SRAM. One of a signal input into the input terminal IN_A and a signal input into the input terminal IN_B is output from the output terminal OUT in accordance with a combination of logic values of selection signals which are held in the SRAM and are output from the terminal D and the terminal DB.

However, in the case where the transistors T11 and T12 are n-channel transistors, a potential of a signal output from the transistor T11 or T12 to the output terminal OUT is lower than one of the potentials of the signals input into the input terminal IN_A and the input terminal IN_B by a threshold voltage of the transistor T11 or T12.

Therefore, it is necessary to make the potential of the terminal D or DB higher than maximum potentials of a signal input into the input terminal IN_A and a signal input into the input terminal IN_B by the threshold voltages or more. This means to increase the power source voltage of the SRAM.

For example, in the case where the maximum potentials of the signals input into the input terminal IN_A and the input terminal IN_B are each +1 V and the threshold voltages of the transistor T11 and the transistor T12 are each +0.5 V, it is necessary to make the potential of the terminal D or DB higher than or equal to +1.5 V. However, in the case where high-speed operation (here, a reduction in the resistance of the multiplexer) is necessary, the potential of the terminal D or DB needs to be higher than or equal to +1.6 V, preferably higher than or equal to +1.7 V. Therefore, the potential of a high-potential node of the SRAM needs to be higher than or equal to +1.6 V, preferably higher than or equal to +1.7 V.

Thus, as shown in FIG. 12B, a method for suppressing change in potential of an output signal from an input signal by using a transmission gate TG1 and a transmission gate TG2 instead of the transistors T11 and T12 is employed.

REFERENCE

[Patent Document 1] U.S. Pat. No. 7,030,650 Specification
[Patent Document 2] U.S. Pat. No. 6,781,865 Specification

SUMMARY OF THE INVENTION

However, the multiplexer shown in FIG. 12B includes the transmission gates TG1 and TG2, which each include two transistors of different conductivity types. Therefore, the area of the multiplexer is increased. In order to make an equivalent amount of current flow through a p-channel transistor and an n-channel transistor, a channel width of the p-channel transistor particularly needs to be increased because the field-effect mobility of the p-channel transistor is about one-third of the field-effect mobility of the n-channel transistor. Thus, the area of the p-channel transistor needs to be about three times as large as the area of the n-channel transistor, for example.

In addition, even when an inverter used for the SRAM is stable, a slight amount of current (standby current) flows between the high-potential node and a low-potential node. The standby current increases significantly with miniaturization of a circuit; therefore, an increase in power consumption in a standby state has been a problem. Note that the standby current increases exponentially to the power source voltage of the inverter.

Particularly in the multiplexer including the transfer gates, which is shown in FIG. 12A, the power source voltage of the SRAM needs to be set higher as described above; therefore, the standby current increases significantly.

Accordingly, one embodiment of the present invention provides a method for driving a semiconductor device capable of reducing an area of a multiplexer and reducing its power consumption.

One embodiment of the present invention is a method for operating a semiconductor device including a selection circuit that includes a memory and a multiplexer. In the memory, one of a source and a drain of a first transistor is connected to a first capacitor, and one of a source and a drain of a second transistor is connected to a second capacitor. In the multiplexer, in a third transistor, one of a source and a drain is connected to a first input terminal and the other of the source and the drain is connected to an output terminal and, in a fourth transistor, one of a source and a drain is connected to a second input terminal and the other of the source and the drain is connected to the output terminal. Further, the method for operating the semiconductor device includes a first step and a second described below. In the first step, a potential (a first potential) which is higher than maximum potentials of a first signal input into the first input terminal and a second signal input into the second input terminal and which can turn on the third transistor regardless of the first signal input into the first input terminal and the second signal input into the second input terminal is held in a first node to which the one of the source and the drain of the first transistor, one of a pair of electrodes of the first capacitor, and a gate of the third transistor are connected, and then a potential which can turn off the fourth transistor regardless of the first signal input into the first input terminal and the second signal input into the second input terminal is held in a second node to which the one of the source and the drain of the second transistor, one of a pair of electrodes of the second capacitor, and a gate of the fourth transistor are connected. In the second step, the first signal is input into the first input terminal and the second signal is input into the second input terminal, and the first signal is output from the output terminal.

Another embodiment of the present invention is a method for operating a semiconductor device including a selection circuit that includes a memory and a multiplexer. In the memory, one of a source and a drain of a first transistor is connected to a first capacitor, and one of a source and a drain of a second transistor is connected to a second capacitor. In the multiplexer, in a third transistor, one of a source and a drain is connected to a first input terminal and the other of the source and the drain is connected to an output terminal and, in a fourth transistor, one of a source and a drain is connected to a second input terminal and the other of the source and the drain is connected to the output terminal. Further, the method for operating the semiconductor device includes a first step and a second described below. In the first step, a first potential is held in one of a first node to which the one of the source and the drain of the first transistor, one of a pair of electrodes of the first capacitor, and a gate of the third transistor are connected and a second node to which the one of the source and the drain of the second transistor, one of a pair of electrodes of the second capacitor, and a gate of the fourth transistor are connected, and then a second potential higher than the first potential is held in the one of the first node and the second node. In the second step, a first signal is input into the first input terminal and a second signal is input into the second input terminal, and one of the first signal and the second signal is output from the output terminal.

Note that in the first step, one of the third transistor and the fourth transistor is turned on by holding the first potential in the one of the first node and the second node in such a manner that a signal input into the other of the source and the drain of the first transistor and a signal input into the other of the source and the drain of the second transistor are complementary to each other. Then, the second potential may be held in the one of the first node and the second node in such a manner that a signal input into the other of the source and the drain of the first transistor and a signal input into the other of the source and the drain of the second transistor have the same potentials.

Note that in the first step, a third potential which turns off the other of the third transistor and the fourth transistor may be held in the other of the first node and the second node.

The potentials of the first node and the second node can be held during a period which is necessary (from 10 milliseconds to 10 years) in such a manner that a transistor whose channel region is formed in a wide-gap semiconductor is formed as each of the first transistor and the second transistor connected to the first node and the second node, respectively, and the capacitance of the first capacitor and the capacitance of the second capacitor are set or selected appropriately. Therefore, it is possible to stop supply of power to the semiconductor device when not used; accordingly, power consumption can be reduced. Moreover, it is not necessary to rewrite data to the first node and the second node at the start-up of the semiconductor device; thus, the starting time can be shortened and the power consumption can be reduced.

Further, after the first potential is held in the first node to which the one of the source and the drain of the first transistor, the one of the pair of electrodes of the first capacitor, and the gate of the third transistor are connected or the second node to which the one of the source and the drain of the second transistor, the one of the pair of electrodes of the second capacitor, and the gate of the fourth transistor are connected, the second potential higher than the first potential is held in the first node or the second node, whereby characteristics higher than or equal to those of a transmission gate can be obtained. Accordingly, a p-channel transistor is not necessary and it is possible to reduce the area of the selection circuit.

Furthermore, the gate of the third transistor or the gate of the fourth transistor is supplied with a potential which can turn on the third transistor or the fourth transistor regardless of the potentials of the signals input into the first input terminal and the second input terminal. In one embodiment of the present invention, even without a circuit such as an SRAM, which includes an inverter, it is possible to turn on or off the transistors T3 or T4; therefore, standby current does not flow and power consumption can be reduced greatly.

According to one embodiment of the present invention, it is possible to reduce power consumption of a semiconductor device including a selection circuit, reduce the area of the selection circuit in the semiconductor device, and downsize the size of the semiconductor device.

BRIEF DESCRIPTION OF THE DRAWINGS

FIG. 2 is a timing chart showing manners for operating a selection circuit of one embodiment of the present invention.

DETAILED DESCRIPTION OF THE INVENTION

Figure 1:
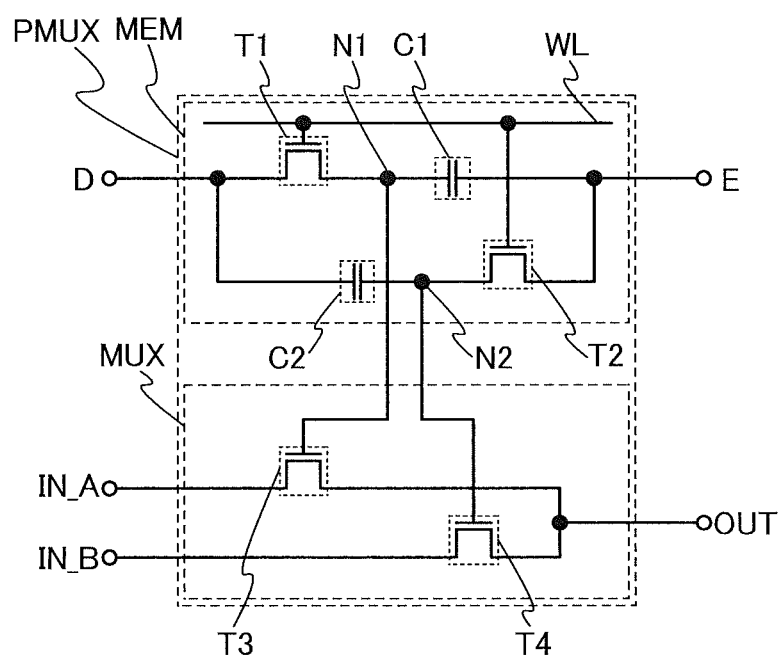
FIG. 1 is a circuit diagram showing a selection circuit of one embodiment of the present invention.

Embodiments of the present invention will be described below with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Note that functions of the "source" and "drain" may be switched in the case where transistors of different polarities are employed or in the case where the direction of a current flow changes in a circuit operation, for example. Therefore, the terms "source" and "drain" can be used to denote the drain and the source, respectively, in this specification.

In addition, even when a circuit diagram shows independent components as if they are electrically connected to each other, there is actually a case where one conductive film has functions of a plurality of components such as a case where part of a wiring also functions as an electrode. The "electrical connection" in this specification includes in its category such a case where one conductive film has functions of a plurality of components.

Note that the position, size, range, or the like of each component in drawings and the like is not accurately represented in some cases for easy understanding. Therefore, the disclosed invention is not necessarily limited to the position, size, range, or the like as disclosed in the drawings and the like.

The ordinal number such as "first", "second", and "third" are used in order to avoid confusion among components.

Embodiment 1

In this embodiment, one embodiment of a semiconductor device including a selection circuit and a method for driving the semiconductor device will be described with reference to FIG. 1, FIG. 2, FIGS. 3A and 3B, and FIG. 4.

FIG. 1 is a circuit diagram of a selection circuit PMUX including a memory MEM and a multiplexer MUX.

In FIG. 1, the memory MEM includes a transistor T1, a capacitor C1, a transistor T2, and a capacitor C2.

In the transistor T1, one of a source and a drain is connected to a terminal D, the other of the source and the drain is connected to a first electrode of the capacitor C1, and a gate is connected to a word line WL. A second electrode of the capacitor C1 is connected to a terminal E.

In the transistor T2, one of a source and a drain is connected to the terminal E, the other of the source and the drain is connected to a first electrode of the capacitor C2, and a gate is connected to the word line WL. A second electrode of the capacitor C2 is connected to the terminal D.

The multiplexer MUX includes a transistor T3 and a transistor T4.

In the transistor T3, one of a source and a drain is connected to an input terminal IN_A, and the other of the source and the drain is connected to an output terminal OUT. A gate of the transistor T3 is connected to the other of the source and the drain of the transistor T1 and the first electrode of the capacitor C1, and such a connection portion is referred to as a node N1.

In the transistor T4, one of a source and a drain is connected to an input terminal IN_B, and the other of the source and the drain is connected to the output terminal OUT. A gate of the transistor T4 is connected to the other of the source and the drain of the transistor T2 and the first electrode of the capacitor C2, and such a connection portion is referred to as a node N2.

Here, the capacitance of the capacitor C1 is set equal to the capacitance of the node N1, and the capacitance of the capacitor C2 is set equal to the capacitance of the node N2. Note that the capacitance of the node N1 includes gate capacitance in the case where the transistor T3 is on in addition to parasitic capacitance between wirings or the like, and the capacitance of the node N2 includes gate capacitance in the case where the transistor T4 is on in addition to parasitic capacitance between wirings or the like.

Next, manners for operating the selection circuit are described with reference to FIG. 2, FIGS. 3A and 3B, and FIG. 4.

FIG. 2 is a timing chart showing potentials of the terminal D, the terminal E, the word line WL, the node N1, the node N2, the input terminal IN_A, the input terminal IN_B, and the output terminal OUT.

A low potential and a high potential of the terminal D are set to VD_L (e.g., 0 V) and VD_H (e.g., +1 V), respectively. A low potential and a high potential of the terminal E are set to VE_L (e.g., 0 V) and VE_H (e.g., +1 V), respectively.

A low potential and a high potential of the word line WL are set to VWL_L (e.g., 0 V) and VWL_H (e.g., +2 V), respectively.

A low potential and a high potential of each of the input terminals IN_A and IN_B are set to VIN_L (e.g., 0 V) and VIN_H (e.g., +1 V), respectively. It is preferred that VD_H≤VIN_H, VE_H≤VIN_H, VD_L≥VIN_L, and VE_L≥VIN_L, and more preferably, VD_H=VE_H=VIN_H and VD_L=VE_L=VIN_L. Particularly when VD_H and VE_H are set to be much lower than VIN_H or when VD_L and VE_L are set to be much higher than VIN_L, change in the potential of the word line WL can be made much smaller; therefore, power consumption of a semiconductor device can be reduced.

Figure 3A:
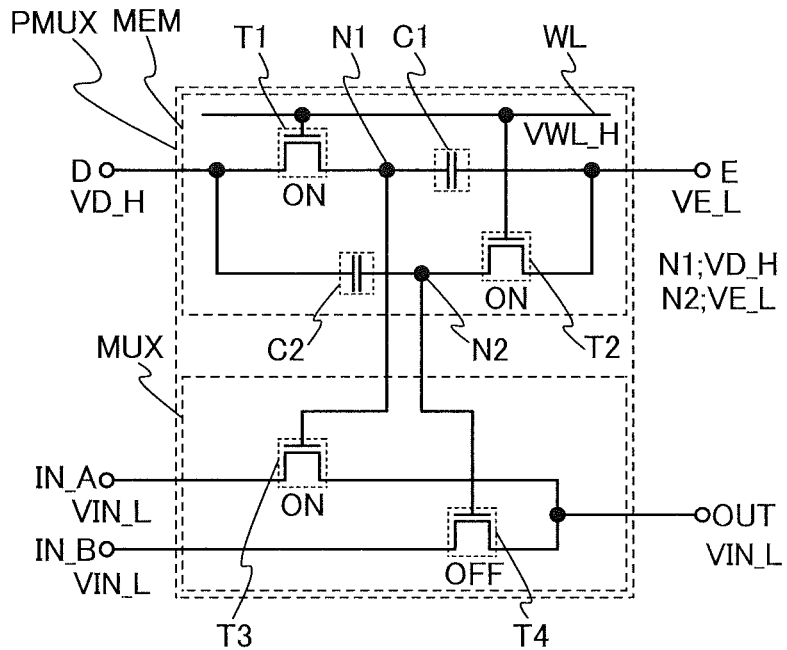
FIGS. 3A and 3B are circuit diagrams showing manners for operating a selection circuit of one embodiment of the present invention.
Figure 3B:
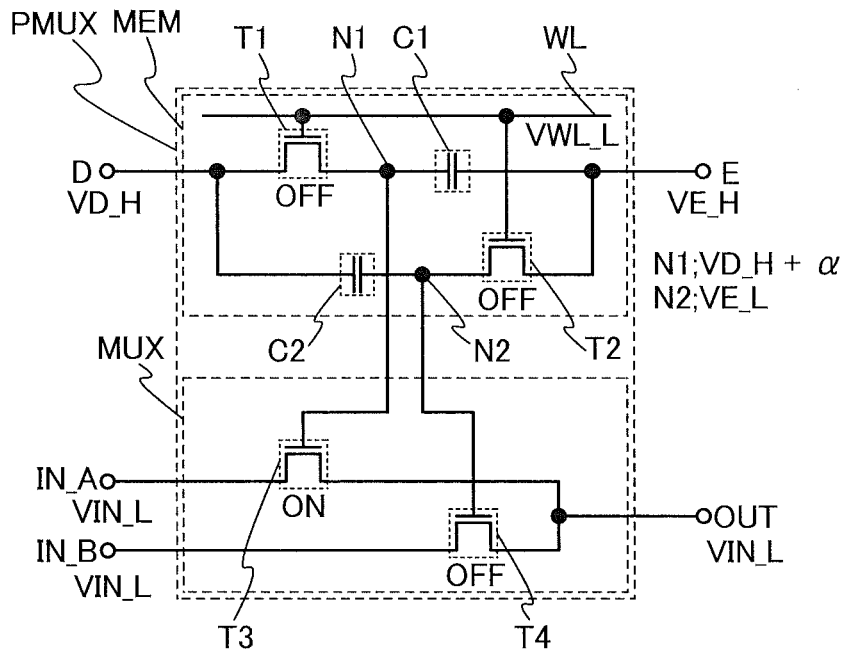
Figure 4:
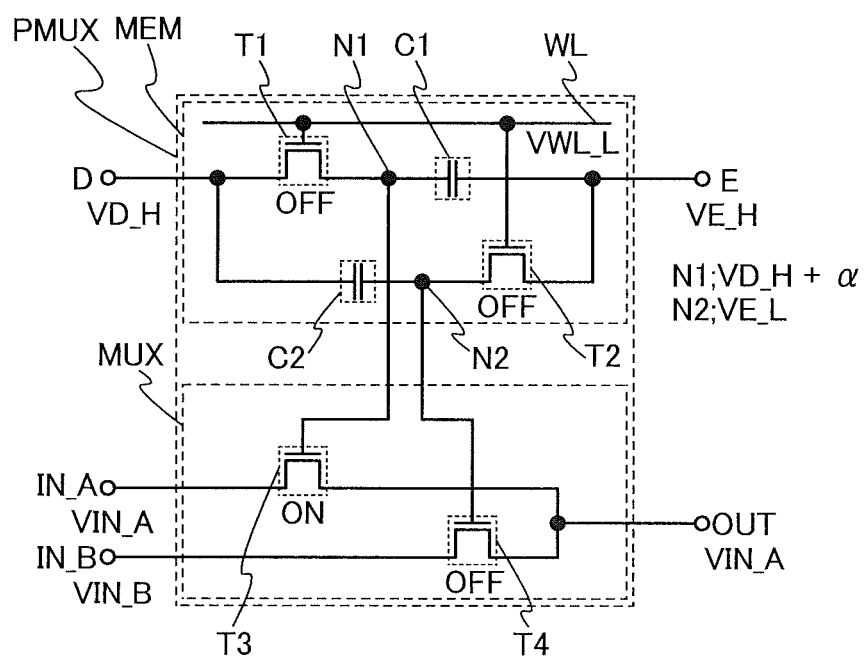
FIG. 4 is a circuit diagram showing a manner for operating a selection circuit of one embodiment of the present invention.

FIGS. 3A and 3B each show a manner for operating the selection circuit PMUX in a program mode 40 of FIG. 2, and FIG. 4 shows a manner for operating the selection circuit PMUX in a user mode 43 of FIG. 2. Note that the program mode 40 includes a first period 41 in which data is written in the memory MEM and a second period 42 in which a potential of the node N1 or N2 is controlled and the state of the multiplexer MUX is determined. The user mode 43 is a period in which given data are input into the input terminals IN_A and IN_B and the data is output in accordance with the state of the multiplexer MUX which is set in advance.

Note that a threshold voltage of the transistor T1, a threshold voltage of the transistor T2, a threshold voltage of the transistor T3, and a threshold voltage of the transistor T4 are set to Vth_T1, Vth_T2, Vth_T3, and Vth_T4, respectively. Note that Vth_T1 and Vth_T2 are set to the same threshold voltages (e.g., +1 V), and Vth_T3 and Vth_T4 are set to the same threshold voltages, which are lower than Vth_T1 and Vth_T2 (e.g., +0.5 V).

The manner for operating the selection circuit PMUX in the first period 41 of the program mode 40 is described with reference to FIG. 2 and FIG. 3A.

In the first period 41 of the program mode 40, the potentials of the input terminals IN_A and IN_B are each set to a low potential, that is, VIN_L. It seems that the input terminals IN_A and IN_B and the output terminal OUT are insulated by the transistors T3 and T4. However, in the case where the transistors T3 and T4 are normal MOS transistors including silicon, the input terminals IN_A and IN_B and the output terminal OUT can be regarded as conducted therebetween in the time scale longer than 10 milliseconds; therefore, the potential of the output terminal OUT is also VIN_L.

Next, the potential of one of the terminals D and E is set to a high potential and the potential of the other thereof is set to a low potential so that one of the transistors T3 and T4 is turned on. For example, the potential of the terminal D is set to a high potential, that is, VD_H and the potential of the terminal E is set to a low potential, that is, VE_L so that the transistor T3 is turned on and the transistor T4 is turned off. Further, a high potential, that is, VWL_H is applied to the word line WL.

Accordingly, the transistors T1 and T2 are on, the potential of the node N1 corresponds to the high potential of the terminal D, that is, VD_H, and the potential of the node N2 corresponds to the low potential of the terminal E, that is, VE_L. At this stage, the transistor T3 is on and the transistor T4 is off. After that, the potential of the word line WL is set to a low potential, that is, VWL_L.

The manner for operating the selection circuit PMUX in the second period 42 of the program mode 40 is described with reference to FIG. 2 and FIG. 3B.

In the second period 42 of the program mode 40, the transistors T1 and T2 are turned off. Further, the potential of the terminal D and the potential of the terminal E are set to high potentials, that is, VD_H and VE_H, respectively. At this time, the node N1 is in a floating state; therefore, the potential of the node N1 becomes VD_H+α (note that α=(VE_H−VE_L)/2) due to capacitive coupling of the transistor T1 and the capacitor C1. Note that the potential of the node N2 remains at VE_L. At this stage, the transistor T3 is on and the transistor T4 is off.

Through the above manners, the potential of the node N1 or N2 can be made higher than the high potentials of the other components. That is, the potential of the gate of the transistor T3 or T4 included in the multiplexer MUX can be made higher than a potential of a signal input into the input terminal IN_A or IN_B by a voltage higher than or equal to the threshold voltage of the transistor T3 or T4.

Thus, the program mode is terminated.

The manner for operating the selection circuit PMUX in the user mode 43 is described with reference to FIG. 2 and FIG. 4.

In the user mode 43, the potential of the terminal D and the potential of the terminal E are set to high potentials, that is, VD_H and VE_H, respectively, and the potential of the word line WL is set to a low potential, that is, VWL_L to turn off the transistors T1 and T2.

The input terminals IN_A and IN_B are supplied with given potentials, for example, pulses as shown in FIG. 2. At this time, the potential of the node N1 is VD_H+α and the potential of the node N2 is VE_L; thus, the transistor T3 is on and the transistor T4 is off. Therefore, the pulse input into the input terminal IN_B (shown as VIN_B in FIG. 4) is not output from the output terminal OUT, and only the pulse input into the input terminal IN_A (shown as VIN_A in FIG. 4) is output from the output terminal OUT. Here, a potential of a signal output from the other of the source and the drain of the transistor T3 is output to the output terminal OUT substantially without being decreased from the potential of the signal input into the one of the source and the drain of the transistor T3 from the input terminal IN_A as long as VD_H+α≥VIN_H+Vth_T3. In the case of the equation where VD_H=VE_H=VIN_H=+1 V and the equation where VD_L=VE_L=VIN_L=0 V, where a=+0.5 V and both Vth_T3 and Vth_T4 are set to +0.5 V, the high potential of the pulse input from the input terminal IN_A is output from the output terminal OUT while remaining at the same potential.

Note that since the high potential of the node N1 is the same as the high potential of the input terminal IN_A in the case where the potential of the node N1 is the high potential VD_H, a potential lower by Vth_T3, that is, VIN_H−Vth_T3 is output from the output terminal OUT. For example, in the case where both Vth_T3 and Vth_T4 are +0.5 V, a potential lower than the potential of the pulse input from the input terminal IN_A by 0.5 V is output from the output terminal OUT.

Note that the capacitance of the capacitor C1 is preferred to be larger than the capacitance of the node N1 because the increase amount in the potential of the node N1 is increased in such a case. Moreover, the capacitance of the capacitor C2 is preferred to be larger than the capacitance of the node N2 because the increase amount in the potential of the node N2 is increased in such a case. Note that it is preferred to reduce the amount of parasitic capacitance generated in the nodes N1 and N2 by bringing the multiplexer MUX and the memory MEM close to each other because the increase amount in the voltage of the node N1 or N2 in the second period 42 of the program mode is reduced when a large amount of parasitic capacitance is generated in the nodes N1 and N2.

The transistors T1 and T2 included in the memory MEM are each preferred to be a transistor whose channel region is formed in a wide-gap semiconductor. The wide-gap semiconductor is a semiconductor whose band gap is higher than or equal to 2 eV, preferably higher than or equal to 2.5 eV, more preferably higher than or equal to 3 eV. Typical examples of the wide-gap semiconductor include a compound semiconductor such as a gallium nitride, an aluminum nitride, or an indium nitride; a silicon carbide; and an oxide semiconductor. Typical examples of the oxide semiconductor include an In—Ga—Zn-based oxide semiconductor, an indium oxide, an indium tin oxide, an indium gallium oxide, an indium zinc oxide, a tin oxide, a zinc oxide, and a gallium oxide. Note that each of the transistors T1 and T2 is not limited to the transistor whose channel region is formed in the wide-gap semiconductor, and a transistor whose channel region is formed in silicon or the like can be used in the case where a period in which data is held in the nodes N1 and N2 is short. Note that the transistor whose channel region is formed in an oxide semiconductor will be described in detail in Embodiment 3.

A transistor whose channel region is formed in a wide-gap semiconductor has a small off-state current. Further, a transistor whose channel region is formed in an oxide semiconductor has an extremely small off-state current. Typically, the off-state current (here, per unit channel width (1 μm)) at room temperature (25° C.) is less than or equal to 100 zA (1 zA (zeptoampere) is $1 \times 10^{-21}$ A), preferably less than or equal to 10 zA, more preferably less than or equal to 100 yA (1 yA (yoctoampere) is $1 \times 10^{-24}$ A). Therefore, with the use of the transistor whose channel region is formed in the wide-gap semiconductor, preferably the oxide semiconductor, for each of the transistors T1 and T2, the potentials of the nodes N1 and N2 can be held during a given period (from 10 milliseconds to 10 years). Therefore, it is possible to stop supply of power to the semiconductor device when not used; accordingly, power consumption can be reduced. Moreover, it is not necessary to rewrite data to the nodes N1 and N2 at the start-up; thus, the starting time can be shortened and the power consumption can be reduced.

Note that it is also possible to use a semiconductor other than a wide-gap semiconductor, for example, bulk silicon or a silicon thin film for each of the transistors T1 and T2. In the case where the potentials of the nodes N1 and N2 change with time, the above manners for operating the selection circuit PMUX in the program mode is favorably repeated at appropriate intervals. Note that with the use of the transistor whose channel region is formed in the oxide semiconductor for each of the transistors T1 and T2, it is possible to set longer an interval between the program modes which are repeated and reduce the number of rewriting times. Accordingly, power consumption can be reduced.

Figure 12A:
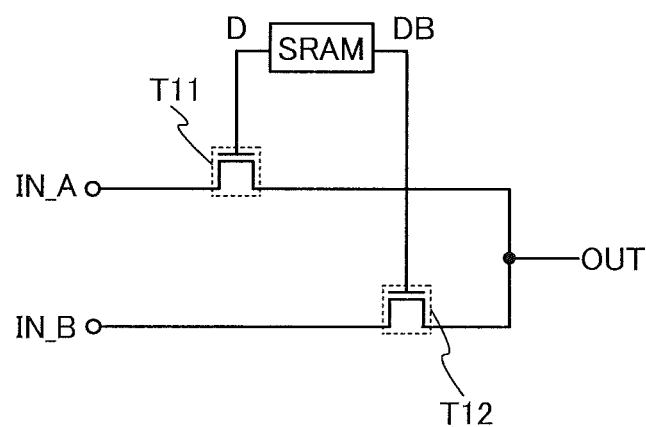
FIGS. 12A and 12B are circuit diagrams each illustrating a conventional selection circuit.
Figure 12B:
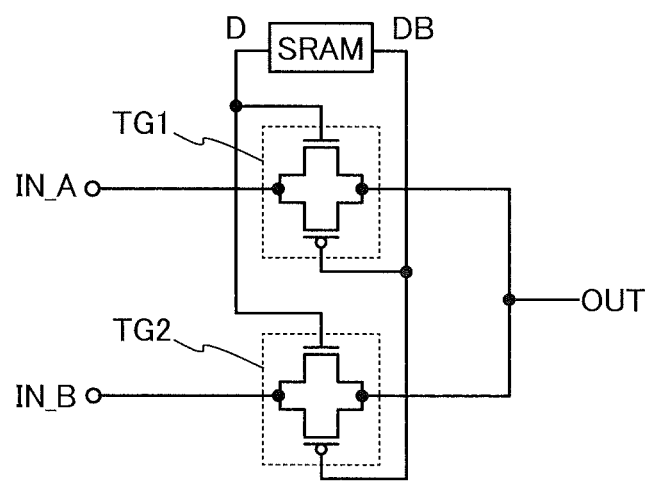

In the selection circuit of this embodiment, characteristics higher than or equal to those of a transmission gate as shown in FIG. 12B can be obtained. Accordingly, a p-channel transistor is not necessary and it is possible to reduce the area of the selection circuit. Alternatively, the transistors T3 and T4 shown in FIG. 1 can be provided in the regions of the multiplexer shown in FIG. 12B, where the p-channel transistors need to be provided, and the on-state current of each of the transistors T3 and T4 can be increased by enlarging the channel width of the transistor. Therefore, the response speeds of the transistors T3 and T4 are improved and high-speed operation of the selection circuit can be achieved.

Note that the transfer gate is featured in that rise of a pulse is sharper than that in the transmission gate when the gate potential is sufficiently high, and a period of time in which an intermediate potential (a potential which is neither a high potential nor a low potential) of the pulse exists is sufficiently short. The potential of the output terminal OUT is input into an inverter via some kind of path, and when the intermediate potential of the pulse is input, a shoot-through current is generated between a high-potential node and a low-potential node of the inverter. Therefore, not only an increase of power consumption but also deterioration or breakdown of the inverter is also caused. Accordingly, it is preferred that the period of time in which the intermediate potential is input is short as much as possible.

Figure 6:
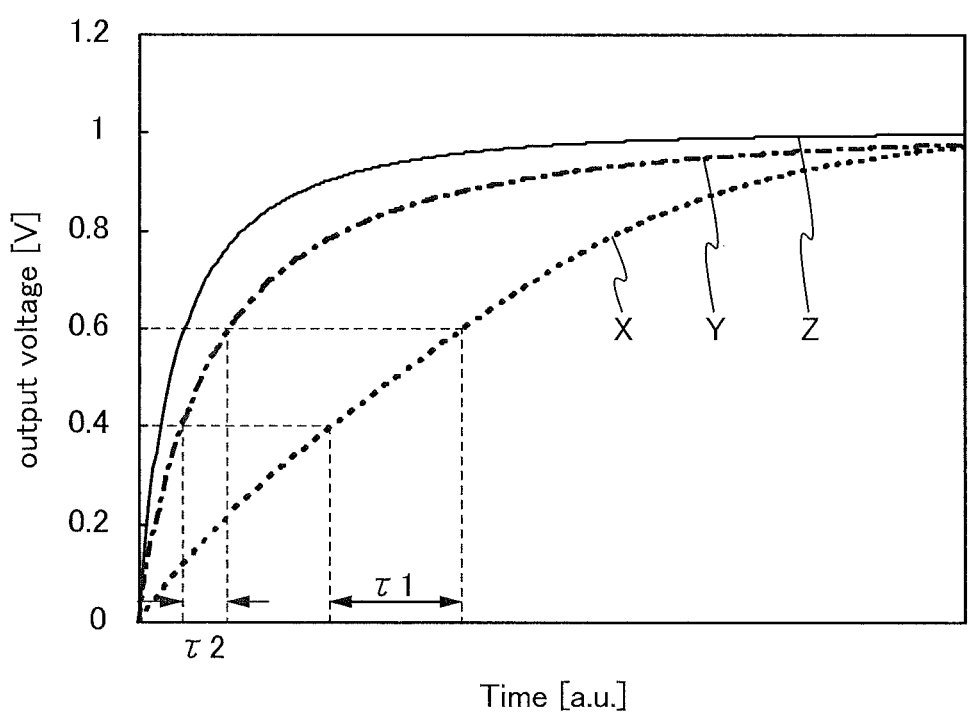
FIG. 6 shows examples of output waveforms of selection circuits.

FIG. 6 shows results of the numerical calculation of the waveforms of pulses output from selection circuits including a transmission gate or a transfer gate. Here, a gradual channel model was used to analyze transistor characteristics. The gate capacitance of the transmission gate and the transfer gate can be ignored because the gate capacitance is sufficiently small compared with capacitance of a load. Further, a pulse input into the selection circuit is considered to be in an ideal state in which the potential is raised from 0 V to +1 V in an infinitely short time.

A curve X indicates a waveform of a pulse output from the transmission gate. A gate potential of an n-channel transistor (threshold voltage: +0.5 V) was set to +1 V, and a gate potential of a p-channel transistor (threshold voltage: −0.5 V) was set to +0 V. The channel width of the n-channel transistor and the channel width of the p-channel transistor were set to be effectively the same. Thus, the channel width of the p-channel transistor is actually three times as large as the channel width of the n-channel transistor.

As apparent from FIG. 6, the curve X is raised linearly. Therefore, a period of time in which an intermediate potential of the pulse exists is relatively long. Note that the intermediate potential ranging from +0.4 V to +0.6 V is favorably assumed. In the transmission gate of FIG. 6, $\tau1$ denotes a period of time in which the intermediate potential exists.

A curve Y indicates a waveform of a pulse output from the transfer gate. A gate potential of an n-channel transistor (threshold voltage: +0.5 V) was set to +1.6 V. The channel width of the n-channel transistor was set to the same as the channel width of the n-channel transistor in the above transmission gate. In the curve Y, the pulse is raised more sharply, and a period of time $\tau2$ in which an intermediate potential exists is about one-third of ti. Accordingly, occurrence of a shoot-through current can be further suppressed.

A curve Z indicates a waveform of a pulse output from a transfer gate whose channel width is twice as large as the channel width of the transfer gate in the curve Y. In the curve Z, the pulse is raised much more sharply, and a period of time in which an intermediate potential exists is about half of $\tau2$. Accordingly, occurrence of a shoot-through current can be further suppressed.

Note that although the two-input and one-output selection circuit is shown as the selection circuit in this embodiment, a 2n-input and one-output selection circuit (n is an integer larger than or equal to 1) or a selection circuit having another number of inputs and another number of outputs can be employed as appropriate.

Embodiment 2

In this embodiment, a semiconductor device including the selection circuit described in Embodiment 1 will be described. Note that here, the semiconductor device includes, in its category, a variety of semiconductor integrated circuits formed using semiconductor elements, such as memory devices, processors, central processing units (CPUs), image processing circuits, digital signal processors (DSPs), microcontrollers, and reconfigurable logic circuits. In addition, the semiconductor device of the present invention also includes, in its category, various devices formed using the above semiconductor integrated circuits, such as RF tags and display devices. The display devices include, in its category, liquid crystal display devices, light-emitting devices having pixels each provided with a light-emitting element typified by an organic light-emitting element (OLED), electronic paper, digital micromirror devices (DMDs), plasma display panels (PDPs), field emission displays (FEDs), and the like. In this embodiment, the reconfigurable logic circuit is described as one embodiment of the semiconductor device.

Figure 5A:
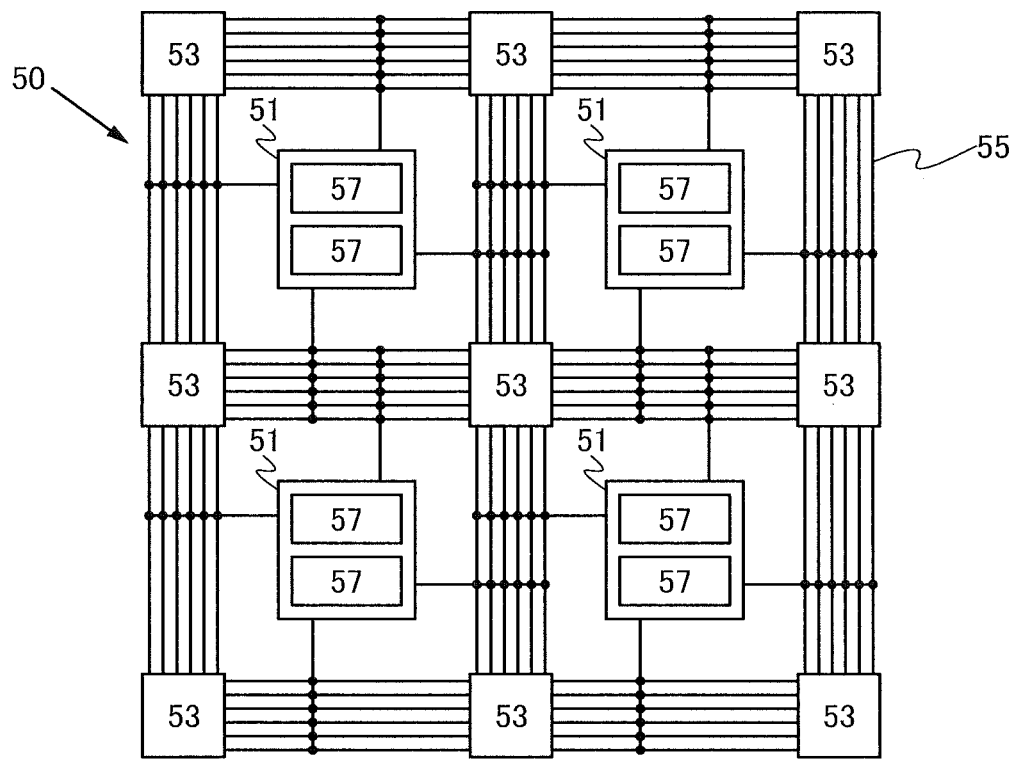
FIGS. 5A and 5B are block diagrams showing a semiconductor device of one embodiment of the present invention.

FIG. 5A is a block diagram showing one embodiment of a reconfigurable logic circuit 50. The reconfigurable logic circuit 50 includes an input/output block (not shown) which is provided on the periphery of the reconfigurable logic circuit 50 and which controls an input signal from the outside and an output signal to the outside, a plurality of logic blocks 51 which have various functions, wirings 55 connected to the logic blocks 51, and a programmable switch 53 which changes a connection state of the wirings 55 by a switch or the like. The logic block 51 includes a plurality of logic elements 57. Further, the reconfigurable logic circuit 50 may further include a multiplier, a phase locked loop (PLL) block, a memory, or the like. The multiplier has a function of multiplying plural pieces of data at a high speed. The PLL block has a function of supplying a clock signal to a circuit in the logic element 57.

Figure 5B:
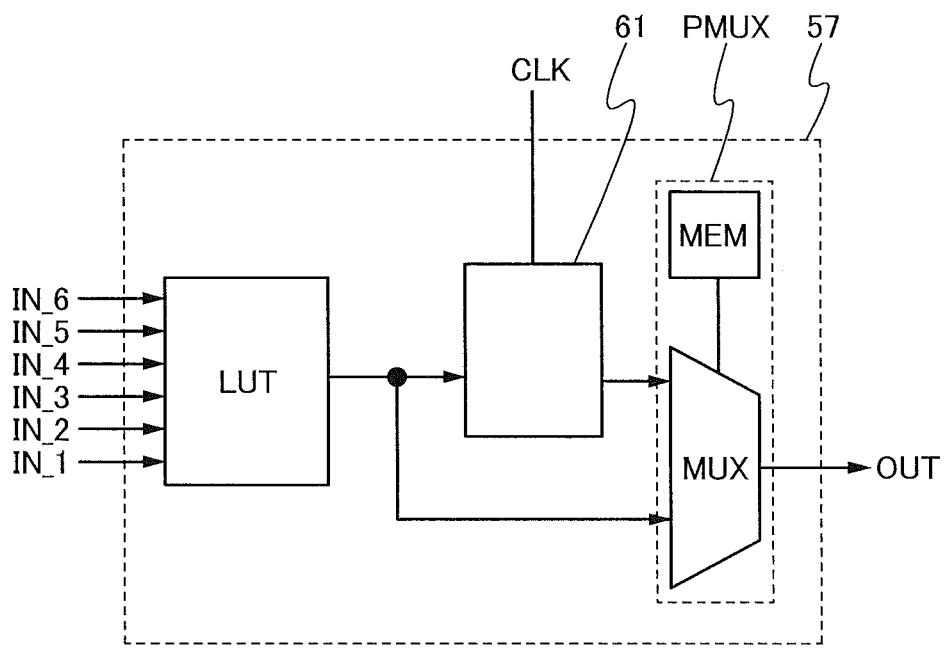

FIG. 5B is a block diagram showing one embodiment of the logic element 57. The logic element 57 can change the function of the logic block 51 as appropriate by changing configuration data that are set corresponding to a plurality of circuit configurations (contexts). Note that the configuration data is stored in a memory provided in the logic block 51.

The logic element 57 includes a look-up table LUT including a configuration memory and a selection circuit, a register 61, and a selection circuit PMUX for switching between an output of the register 61 and an output of the look-up table LUT. Here, as the selection circuit PMUX, such a two-input and one-output selection circuit including the memory MEM and the multiplexer MUX as described in Embodiment 1 can be used.

The look-up table LUT performs arithmetic processing on an input signal in response to configuration data and outputs a signal.

Part of the signal output from the look-up table LUT is held in the register 61. A clock signal CLK is input into the register 61, and the signal held in the register 61 is synchronized with the clock signal CLK. Then, the signal is output to the selection circuit PMUX.

The selection circuit PMUX chooses one of the output signal from the look-up table LUT and the output signal from the register 61. In accordance with input of a selection signal, the output signal from the look-up table LUT or the output signal from the register 61 is output from the logic element 57 to another logic element.

In FIG. 5B, the selection circuit PMUX described in Embodiment 1 can be provided between the register 61 and an output terminal OUT. Note that the selection circuit described in Embodiment 1 can be used as the selection circuit provided in the look-up table LUT. Alternatively, the selection circuit described in Embodiment 1 can be provided between the look-up table LUT and the register 61.

Next, another structure of the logic element 57, in which selection circuits PMUX_1, PMUX_2, PMUX_3, and PMUX_4 are provided between the wirings 55 and the look-up table LUT, is described with reference to FIGS. 7A and 7B.

Figure 7A:
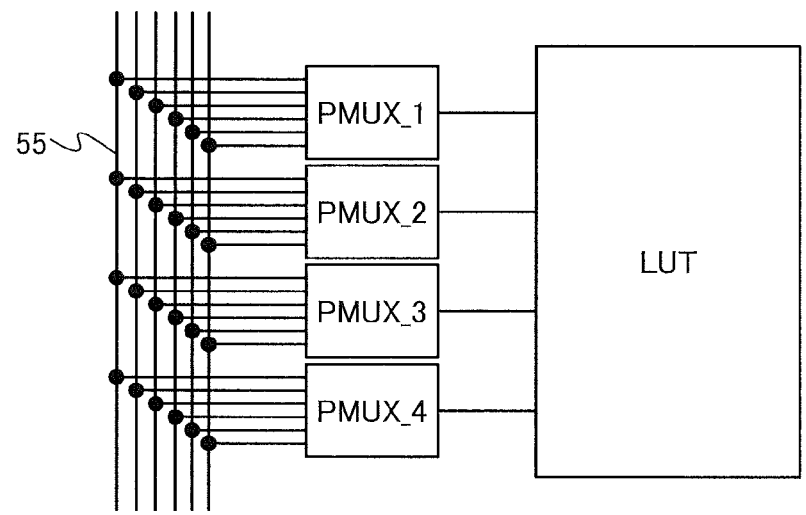
FIGS. 7A and 7B are block diagrams showing a semiconductor device of one embodiment of the present invention.
Figure 7B:
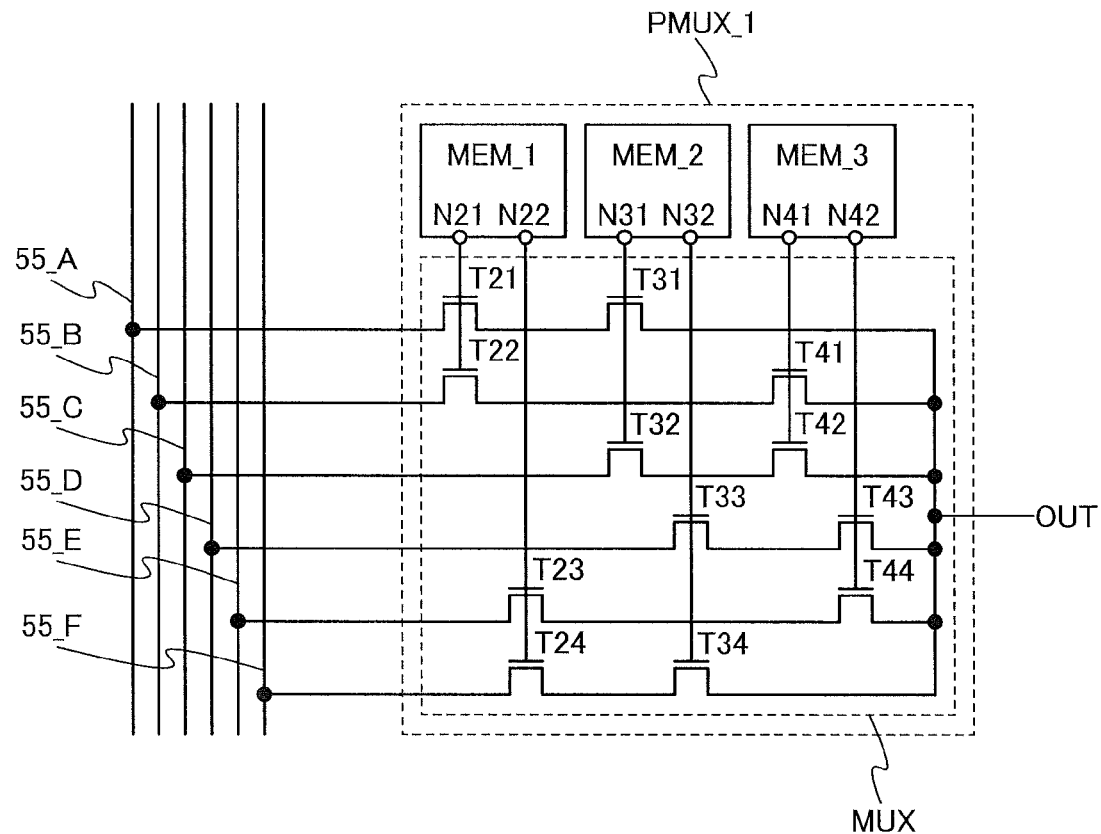

FIG. 7A is an enlarged diagram of a region of the logic element 57, in which the wirings 55 are connected to the look-up table LUT through the selection circuits PMUX_1 to PMUX_4. FIG. 7B is an enlarged diagram of the portion in FIG. 7A, in which the wirings 55 are connected to the selection circuit PMUX_1.

The selection circuit PMUX_1 includes memories MEM_1, MEM_2, and MEM_3. The selection circuit PMUX_1 further includes a transistor T21 whose gate is connected to a node N21 of the memory MEM_1 and one of whose source and drain is connected to a wiring 55A, a transistor T22 whose gate is connected to the node N21 of the memory MEM_1 and one of whose source and drain is connected to a wiring 55B, a transistor T23 whose gate is connected to a node N22 of the memory MEM_1 and one of whose source and drain is connected to a wiring 55E, and a transistor T24 whose gate is connected to the node N22 of the memory MEM_1 and one of whose source and drain is connected to a wiring 55F.

The selection circuit PMUX_1 still further includes a transistor T31 whose gate is connected to a node N31 of the memory MEM_2 and one of whose source and drain is connected to the other of the source and the drain of the transistor T21, a transistor T32 whose gate is connected to the node N31 of the memory MEM_2 and one of whose source and drain is connected to a wiring 55C, a transistor T33 whose gate is connected to a node N32 of the memory MEM_2 and one of whose source and drain is connected to a wiring 55D, and a transistor T34 whose gate is connected to the node N32 of the memory MEM_2 and one of whose source and drain is connected to the other of the source and the drain of the transistor T24.

The selection circuit PMUX_1 still further includes a transistor T41 whose gate is connected to a node N41 of the memory MEM_3 and one of whose source and drain is connected to the other of the source and the drain of the transistor T22, a transistor T42 whose gate is connected to the node N41 of the memory MEM_3 and one of whose source and drain is connected to the other of the source and the drain of the transistor T32, a transistor T43 whose gate is connected to a node N42 of the memory MEM_3 and one of whose source and drain is connected to the other of the source and the drain of the transistor T33, and a transistor T44 whose gate is connected to the node N42 of the memory MEM_3 and one of whose source and drain is connected to the other of the source and the drain of the transistor T23.

The other of the source and the drain of the transistor T31, the other of the source and the drain of the transistor T41, the other of the source and the drain of the transistor T42, the other of the source and the drain of the transistor T43, the other of the source and the drain of the transistor T44, and the other of the source and the drain of the transistor T34 are connected to the output terminal OUT. The output terminal OUT is connected to input terminals of the look-up table LUT.

As shown in FIG. 7A, the selection circuit PMUX described in Embodiment 1 can be provided between the wirings 55 and the look-up table LUT. Note that the selection circuit PMUX_1 shown in FIG. 7B is a six-input and one-output selection circuit.

According to one embodiment of the present invention, it is possible to reduce power consumption of a semiconductor device including a selection circuit, reduce the area of the selection circuit in the semiconductor device, and downsize the size of the semiconductor device.

Embodiment 3

In this embodiment, a structure of the selection circuit will be described with reference to FIGS. 8A and 8B, FIGS. 9A and 9B, and FIGS. 10A and 10B.

FIGS. 8A and 8B and FIGS. 9A and 9B are plan views illustrating the positions and shapes of main structures in the multiplexer and the memory of the selection circuit. FIG. 10A is a cross-sectional view taken along dot-dash-line A-B in FIGS. 8A and 8B and FIGS. 9A and 9B, and FIG. 10B is a cross-sectional view taken along dot-dash-line C-D in FIGS. 8A and 8B and FIGS. 9A and 9B. Note that in FIGS. 10A and 10B, a transistor 704*a* and a transistor 704*b* correspond to the transistor T3 and the transistor T4 shown in FIG. 1, respectively, and a transistor 750 corresponds to the transistor T1 shown in FIG. 1. Further, a capacitor 751 corresponds to the capacitor C1 shown in FIG. 1.

The transistors 704*a* and 704*b* are n-channel transistor (NMOSFET). The transistors 704*a* and 704*b* are electrically isolated from other elements by a shallow trench isolation (STI) 702. The use of the STI 702 can reduce the generation of a bird's beak in an element isolation region, which is caused in an LOCOS element isolation method, and can reduce the size of the element isolation region. On the other hand, in a semiconductor device in which a transistor is not required to be structurally miniaturized or downsized, the STI 702 is not necessarily formed, and an element isolation means such as LOCOS can be used.

The transistor 704*a* includes a channel region in a semiconductor substrate 701, impurity regions 705 (also referred to as a source region and a drain region) which is provided such that the channel region is provided therebetween, a gate insulating film 706*a* over the channel region, and a gate electrode 707*a* over the gate insulating film 706*a* so as to overlap with the channel region. The gate electrode 707*a* can be a single layer or a multilayer. Note that the gate electrode 707*a* may have a stacked-layer structure of a first conductive film formed using a first material for improving processing accuracy and a second conductive film formed using a second material for reducing resistance.

The transistor 704*b* has a structure similar to that of the transistor 704*a* and includes a channel region in the semiconductor substrate 701, the impurity regions 705 (also referred to as a source region and a drain region) which is provided such that the channel region is provided therebetween, a gate insulating film 706*b* over the channel region, and a gate electrode 707*b* over the gate insulating film 706*b* so as to overlap with the channel region.

Further, contact plugs 714*a*, 714*c*, and 714*d* are connected to the impurity regions 705 provided in the semiconductor substrate 701. Here, the contact plugs 714*a*, 714*c*, and 714*d* also function as a source electrode and a drain electrode of the transistors 704*a* and 704*b*. In addition, a contact plug 714*b* connects the gate electrode 707*a* of the transistor 704*a* and a wiring 719*b*.

In addition, impurity regions which are different from the impurity regions 705 are provided between the impurity regions 705 and the channel region. These impurity regions function as LDD regions or extension regions for controlling the distribution of an electric field in the vicinity of the channel region, depending on the concentration of an impurity introduced thereto. Sidewall insulating films 710 are provided on sidewalls of the gate electrode 707*a* and 707*b*. By using the sidewall insulating films 710, the LDD regions or extension regions can be formed.

The transistors 704*a* and 704*b* can be fondled by a known method for manufacturing a MOS (Metal-Oxide-Semiconductor) transistor.

The contact plugs 714*a* to 714*d* are formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given.

The contact plugs 714*a* to 714*d* can be formed in such a manner that a conductive film is formed by a sputtering method, a CVD method, a plating method, or the like, planarization treatment is performed by a chemical mechanical polishing (CMP) method, an etching method, or the like, and then a surface portion of the conductive film, which is unnecessary, is removed.

The transistors 704*a* and 704*b* are covered with an insulating film 711. The insulating film 711 can function as a protective film and can prevent impurities from entering the channel region from the outside. In addition, when the insulating film 711 is formed using a material such as silicon nitride by a CVD method, hydrogenation of single crystal silicon can be performed by heat treatment in the case where the single crystal silicon is used for the channel region. When an insulating film having tensile stress or compressive stress is used as the insulating film 711, distortion can be caused in the semiconductor material in the channel region. By application of tensile stress to a silicon material used for the channel region of an n-channel transistor or application of compressive stress to a silicon material used for the channel region of a p-channel transistor, the effect mobility of the transistor can be increased. The insulating film 711 can be formed by a sputtering method or a CVD method.

An insulating film 712 is formed over the insulating film 711. The insulating film 712 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethyl orthosilicate (TEOS) which is a silicon oxide made from $Si(OC_2H_5)_4$, an insulator made from hydrogen silsesquioxane (HSQ), an insulator made from methyl silsesquioxane (MSQ), organosilicate glass (OSG), or an organic polymer-based material. In particular, in the case of advancing miniaturization of a semiconductor device, parasitic capacitance between wirings is significant and signal delay is increased; therefore, the insulating film 712 is preferred to be formed using a material whose relative permittivity k is low, typically less than or equal to 3.0. In addition, CMP treatment is performed after the contact plugs 714*a* and 714*b* are embedded in the insulating film; therefore, the insulating film needs to have high mechanical strength. As long as their mechanical strength can be secured, the insulating films can be made porous to have a lower dielectric constant. The insulating film 712 is formed by a sputtering method, a CVD method, a coating method including a spin coating method (also referred to as spin on glass (SOG)), or the like.

An insulating film 715 is formed over the insulating film 712. A wiring 719*a*, the wiring 719*b*, a wiring 719*c*, and a wiring 719*d* are embedded in the insulating film 715. The wiring 719*a* is connected to the input terminal IN_A shown in FIG. 1 and to the transistor 704*a* through the contact plug 714*a*. The wiring 719*b* corresponds to part of the node N1 shown in FIG. 1 and is connected to the gate electrode 707*a* of the transistor 704*a* through the contact plug 714*b*. The wiring 719*c* is connected to the output terminal OUT shown in FIG. 1 and to the transistors 704*a* and 704*b* through the contact plug 714*c*. The wiring 719*d* is connected to the input terminal IN_B shown in FIG. 1 and to the transistor 704*b* through the contact plug 714*d*.

The insulating film 715 is formed by a sputtering method, a CVD method, a coating method including a spin coating method, or the like.

The wirings 719*a* to 719*d* are preferred to be formed using a low-resistance conductive material such as copper or aluminum. By using a low-resistance conductive material, RC delay of signals transmitted through the wirings 719*a* to 719*d* can be reduced. In the case where copper is used for the wirings 719*a* to 719*d*, barrier films are preferred to be formed between the insulating film and the wirings 719a to 719d in order to prevent copper from dispersing into the channel region of the semiconductor substrate 701. The barrier films can each be formed using, for example, a film of a tantalum nitride, a stacked-layer film of a tantalum nitride and tantalum, a film of a titanium nitride, a stacked-layer film of a titanium nitride and titanium, or the like, but are not limited to the films of these materials as long as their function of preventing diffusion of a wiring material and their adhesion to the wiring material, a base film, or the like are secured. Note that the contact plugs 714a to 714d and the wirings 719a to 719d may be formed with the same material by a dual damascene method.

Figure 8B:
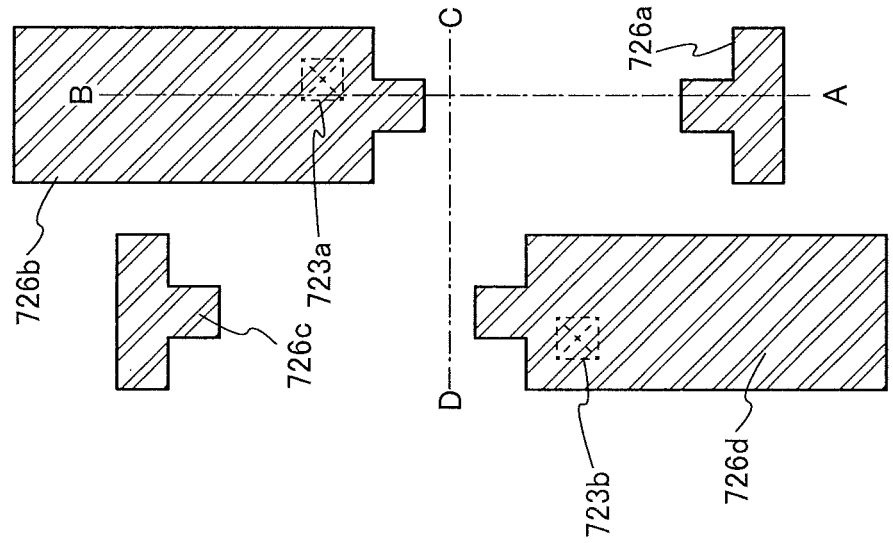
FIGS. 8A and 8B are top views illustrating a semiconductor device of one embodiment of the present invention.
Figure 8A:
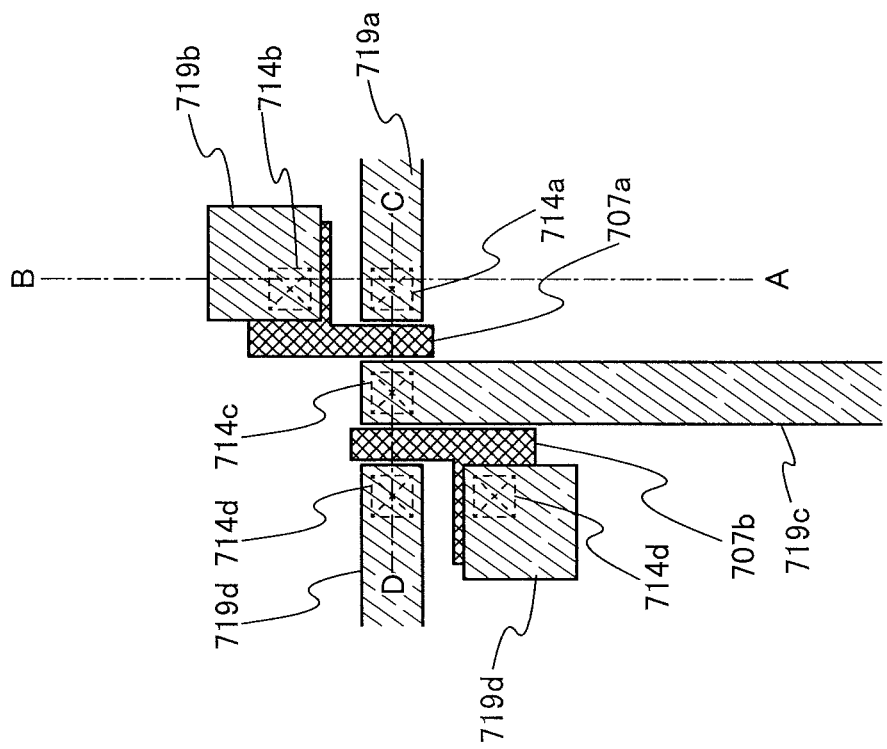

FIG. 8A is a top view of the gate electrodes 707a and 707b, the contact plugs 714a to 714d, and the wirings 719a to 719d.

A barrier film 724 and an insulating film 725 are stacked over the insulating film 715 and the wirings 719a to 719d. Moreover, contact plugs 723a and 723b are embedded in the barrier film 724 and the insulating film 725.

The contact plug 723a is connected to the wiring 719b. The contact plugs 723a and 723b can be formed in a manner similar to that of the contact plugs 714a to 714d.

The barrier film 724 is preferred to be formed using an insulating film having a function of blocking hydrogen, water, and oxygen, which is typically an aluminum oxide film. The barrier film 724 can be formed by a sputtering method or a CVD method.

The insulating film 725 is preferred to be formed using an oxide insulating film from which part of oxygen is released by heating. As such an oxide insulating film from which part of oxygen is released by heating, an oxide insulating film in which the oxygen content is higher than that in the stoichiometric composition is preferred to be used. The oxide insulating film from which part of oxygen is released by heating can make oxygen diffuse into the oxide semiconductor film by heat treatment. Typical examples of the insulating film 725 are films of a silicon oxide, a silicon oxynitride, a silicon nitride oxide, a gallium oxide, a hafnium oxide, an yttrium oxide, an aluminum oxide, an aluminum oxynitride, and the like.

The thickness of the insulating film 725 is larger than or equal to 50 nm, preferably larger than or equal to 200 nm and smaller than or equal to 3000 nm, more preferably larger than or equal to 300 nm and smaller than or equal to 1000 nm. With the use of the thick insulating film 725, the amount of oxygen released from the insulating film 725 can be increased and, in addition, the interface state density at an interface between the insulating film 725 and an oxide semiconductor film to be forming later can be reduced.

Here, "to release part of oxygen by heating" means that the amount of released oxygen is larger than or equal to $1.0 \times 10^{18}$ atoms/cm$^3$, preferably larger than or equal to $3.0 \times 10^{20}$ atoms/cm$^3$ in thermal desorption spectroscopy (TDS) on an oxygen atom basis.

In the above structure, the insulating film from which oxygen is released by heating may be an oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

The insulating film 725 can be formed by a sputtering method or a CVD method. After the insulating film 725 is formed by a CVD method, oxygen may be added to the insulating film 725.

In FIG. 10A, the transistor 750 and the capacitor 751 are formed over the insulating film 725.

The transistor 750 includes a pair of electrodes 726a and 726b over the insulating film 725, an oxide semiconductor film 731a over the insulating film 725 and the pair of electrodes 726a and 726b, a gate insulating film 732 over the oxide semiconductor film 731a, and a gate electrode 733a overlapping with the oxide semiconductor film 731a with the gate insulating film 732 provided therebetween. Moreover, an insulating film 727 covering the gate insulating film 732 and the gate electrode 733a is included. Note that in FIG. 10B, an oxide semiconductor film 731b which functions as the channel region of the transistor T2 shown in FIG. 1 is formed over the insulating film 725.

FIG. 8B is a top view of the contact plugs 723a and 723b, the pair of electrodes 726a and 726b, and a pair of electrodes 726c and 726d. FIG. 9A is a top view of the oxide semiconductor films 731a and 731b, the gate electrode 733a, and second electrodes 733b and 733c.

Note that parasitic capacitance between the electrode 726b and the gate electrode 733a can be made small in such a manner that the pair of electrodes 726a and 726b makes contact with the oxide semiconductor film 731a and the shapes and arrangements of the pair of electrodes 726a and 726b and the gate electrode 733a are made as shown in FIG. 8B and FIG. 9A.

The electrode 726b functions as a first electrode of the capacitor 751; therefore, the potential of the electrode 726b (i.e., the potential of the gate electrode 707a) is decreased due to the off state of the transistor 750. A decrease in the potential of the gate electrode 707a is not preferred for the characteristics of the selection circuit; thus, it is favorable that such a decrease is made as small as possible. Parasitic capacitance between the electrode 726b and the gate electrode 733a can be made small by making the shapes and arrangement of the pair of electrodes 726a and 726b and the gate electrode 733a as described above; therefore, the decrease in the potential of the gate electrode 707a can be suppressed.

The capacitor 751 includes the electrode 726b functioning as the first electrode, which is formed over the insulating film 725, the gate insulating film 732, and the second electrode 733b.

The pair of electrodes 726a and 726b and the pair of electrodes 726c and 726d can be formed using the same material as the contact plugs 714a to 714d. Note that a transparent conductive material containing an indium oxide, a tin oxide, or a zinc oxide may be used for the pair of electrodes 726a and 726b and the pair of electrodes 726c and 726d. The pair of electrodes 726a and 726b and the pair of electrodes 726c and 726d can be formed by a sputtering method, a CVD method, a plating method, or the like.

The oxide semiconductor films 731a and 731b are preferred to contain at least indium (In) or zinc (Zn). Alternatively, the oxide semiconductor films 731a and 731b are preferred to contain both In and Zn. In order to reduce fluctuation in electrical characteristics of the transistors including the oxide semiconductor, the oxide semiconductor is preferred to contain one or more of stabilizers in addition to In and/or Zn.

As examples of the stabilizer, gallium (Ga), tin (Sn), hafnium (Hf), aluminum (Al), zirconium (Zr), and the like can be given. As other examples of the stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given.

As the oxide semiconductor, for example, the following can be used: a single-component metal oxide such as an indium oxide, a tin oxide, or a zinc oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, or an In—W-based metal oxide; a three-component metal oxide such as an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide.

Here, for example, an "In—Ga—Zn-based metal oxide" means an oxide containing In, Ga, and Zn as its main components and there is no particular limitation on the ratio of In, Ga, and Zn. The In—Ga—Zn-based metal oxide may contain a metal element other than In, Ga, and Zn.

Alternatively, a material expressed by $InMO_3(ZnO)_m$ (m>0, and m is not an integer) may be used as the oxide semiconductor. Note that M represents one or more metal elements selected from Ga, Fe, Mn, and Co. Alternatively, as the oxide semiconductor, a material expressed by $In_2SnO_5(ZnO)_n$ (n>0, n is a natural number) may be used.

For example, an In—Ga—Zn-based metal oxide containing In, Ga, and Zn at an atomic ratio of 1:1:1 (=1/3:1/3:1/3), 2:2:1 (=2/5:2/5:1/5), or 3:1:2 (=1/2:1/6:1/3), or an oxide at an atomic ratio close to the above atomic ratios can be used. Alternatively, an In—Sn—Zn-based metal oxide containing In, Sn, and Zn at an atomic ratio of 1:1:1 (=1/3:1/3:1/3), 2:1:3 (=1/3:1/6:1/2), or 2:1:5 (=1/4:1/8:5/8), or an oxide at an atomic ratio close to the above atomic ratios is favorably used.

However, without limitation to the above compositions at the above ratios, a material with appropriate compositions at appropriate ratios may be used in accordance with needed semiconductor characteristics and electrical characteristics (e.g., field-effect mobility and the threshold voltage). In order to obtain needed semiconductor characteristics, it is preferred that the carrier density, the impurity concentration, the defect density, the atomic ratio between metal elements and oxygen, the interatomic distance, the density, and the like be set appropriately.

For example, high mobility of the In—Sn—Zn-based metal oxide can be obtained relatively easily. However, the mobility of the In—Ga—Zn-based metal oxide can also be increased by reducing the defect density in the bulk.

Further, the energy gap of a metal oxide that can form the oxide semiconductor films 731a and 731b is greater than or equal to 2 eV, preferably greater than or equal to 2.5 eV, more preferably greater than or equal to 3 eV. In this manner, as well as being able to withstand a high voltage, the transistor can have a lower off-state current by using an oxide semiconductor having a wide energy gap.

Further, the concentration of hydrogen in the oxide semiconductor films 731a and 731b, which is measured by secondary ion mass spectrometry (SIMS), can be set to be lower than $5 \times 10^{18}$ atoms/cm$^3$, preferably lower than or equal to $1 \times 10^{18}$ atoms/cm$^3$, more preferably lower than or equal to $5 \times 10^{17}$ atoms/cm$^3$, further preferably lower than or equal to $1 \times 10^{16}$ atoms/cm$^3$.

Hydrogen contained in the oxide semiconductor films 731a and 731b reacts with oxygen bonded to a metal atom to produce water, and a defect is formed in a lattice from which oxygen is released (or a portion from which oxygen is released). In addition, a bond of part of hydrogen and oxygen causes generation of electrons serving as carrier. Thus, the impurities containing hydrogen are reduced as much as possible in the step of forming the oxide semiconductor film, whereby it is possible to reduce the concentration of hydrogen in the oxide semiconductor film. Therefore, when an oxide semiconductor which is highly purified by removing hydrogen as much as possible is used as a channel region, the negative shift in the threshold voltage can be reduced, and the leakage current between a source and a drain of the transistor, typically, the off-state current per channel width (1 μm) can be decreased to several yA/μm to several zA/μm. Accordingly, electrical characteristics of the transistor can be improved.

By the heat treatment, the concentration of hydrogen in the oxide semiconductor films 731a and 731b can be reduced.

Further, oxygen vacancies in the oxide semiconductor films 731a and 731b can be reduced, whereby a change in the electrical characteristics of the transistor, which is caused by oxygen vacancies, can be reduced, resulting in higher reliability. It is preferred to use an oxide semiconductor film the oxygen content of which is higher than that in the stoichiometric composition for the oxide semiconductor films 731a and 731b. It is possible to reduce the oxygen vacancies by adding oxygen to an oxide semiconductor film, and as examples of an oxygen addition method, an ion implantation method, an ion doping method, plasma treatment, and the like can be given. Further, after the insulating film from which oxygen is diffused by heating is provided so as to be in contact with the oxide semiconductor film, oxygen is diffused from the insulating film from which oxygen is diffused by heating into the oxide semiconductor film by the heat treatment; thus, the oxygen vacancies can be reduced.

Note that the oxide semiconductor films 731a and 731b may have an amorphous structure, a single crystal structure, or a polycrystalline structure.

As the oxide semiconductor films 731a and 731b, a c-axis aligned crystalline oxide semiconductor (also referred to as CAAC-OS) film having crystal parts may be used.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when θ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferred that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

Further, the oxide semiconductor films 731*a* and 731*b* may have a structure in which a plurality of oxide semiconductor films is stacked. For example, the oxide semiconductor films 731*a* and 731*b* may have a stacked-layer structure of a first oxide semiconductor film and a second oxide semiconductor film which are formed using metal oxides with different compositions at different ratios. For example, the first oxide semiconductor film may be formed using any of two-component metal oxide, a three-component metal oxide, and a four-component metal oxide, and the second oxide semiconductor film may be formed using any of these which is different from the metal oxide used for the first oxide semiconductor film.

The constituent elements of the first oxide semiconductor film and the second oxide semiconductor film are made to be the same but the composition ratio of the constituent elements of the first oxide semiconductor film and the second oxide semiconductor film may be made to be different. For example, the first oxide semiconductor film may contain In, Ga, and Zn at an atomic ratio of 1:1:1, and the second oxide semiconductor film may contain In, Ga, and Zn at an atomic ratio of 3:1:2. Alternatively, the first oxide semiconductor film may contain In, Ga, and Zn at an atomic ratio of 1:3:2, and the second oxide semiconductor film may contain In, Ga, and Zn at an atomic ratio of 2:1:3.

At this time, one of the first oxide semiconductor film and the second oxide semiconductor film, which is closer to the gate electrode (on a channel side), is preferred to contain In and Ga at a proportion where In>Ga. The other oxide semiconductor film which is farther from the gate electrode (on a back channel side) is preferred to contain In and Ga at a proportion where In□Ga.

Further, the oxide semiconductor films $731a$ and $731b$ may have a four-layer structure of a first oxide semiconductor film, a second oxide semiconductor film, a third oxide semiconductor film, and a fourth oxide semiconductor film, in which the constituent elements thereof are made the same but the composition ratio of the constituent elements of the first oxide semiconductor film, the second oxide semiconductor film, the third oxide semiconductor film, and the fourth oxide semiconductor film is made different. For example, the first oxide semiconductor film may contain In, Ga, and Zn at an atomic ratio of 1:3:2, the second oxide semiconductor film may contain In, Ga, and Zn at an atomic ratio of 1:1:1, the third oxide semiconductor film may contain In, Ga, and Zn at an atomic ratio of 3:1:2, and the fourth oxide semiconductor film may contain In, Ga, and Zn at an atomic ratio of 1:3:2.

An oxide semiconductor film which contains less In than Ga and Zn at an atomic ratio, typically, the first oxide semiconductor film and the fourth oxide semiconductor film each containing In, Ga, and Zn at an atomic ratio of 1:3:2, has a higher insulating property than an oxide semiconductor film containing In, Ga, and Zn each at the same atomic ratio, typically, the second oxide semiconductor film, and an oxide semiconductor film containing more In than Ga and Zn at an atomic ratio, typically, the third oxide semiconductor film. Further, when the first oxide semiconductor film and the fourth oxide semiconductor film each containing In, Ga, and Zn at an atomic ratio of 1:3:2 have an amorphous structure, the insulating properties are further improved. Accordingly, the second oxide semiconductor film and the third oxide semiconductor film each serve as a channel region, and the first oxide semiconductor film and the fourth oxide semiconductor film each serve as a gate insulating film.

Since the constituent elements of the first oxide semiconductor film, the second oxide semiconductor film, the third oxide semiconductor film, and the fourth oxide semiconductor film are the same, the first oxide semiconductor film and the fourth oxide semiconductor film have fewer trap levels at the interface with the second oxide semiconductor film and the interface with the third oxide semiconductor film, respectively. Therefore, when the oxide semiconductor films $731a$ and $731b$ each have the above structure, the amount of change in the threshold voltage of the transistor due to a change over time or a BT photostress test can be reduced.

In an oxide semiconductor, the s orbital of heavy metal mainly contributes to carrier transfer, and when the In content in the oxide semiconductor is increased, overlap of the s orbitals is likely to be increased. Therefore, an oxide containing In and Ga at a proportion where In>Ga has higher mobility than an oxide containing In and Ga at a proportion where In≤Ga. Further, in Ga, the formation energy of an oxygen vacancy is larger and thus an oxygen vacancy is less likely to occur, than in In; therefore, the oxide containing In and Ga at a proportion where In□Ga has more stable characteristics than the oxide containing In and Ga at a proportion where In>Ga.

An oxide semiconductor containing In and Ga at a proportion where In>Ga is used on the channel side and an oxide semiconductor containing In and Ga at a proportion where In≥Ga is used on the back channel side, so that field-effect mobility and reliability of the transistor can be further improved.

Further, the oxide semiconductor films $731a$ and $731b$ may be formed by employing a stacked-layer structure of oxide semiconductors having different crystallinity. That is, the oxide semiconductor films may be formed using any of a single crystal oxide semiconductor, a polycrystalline oxide semiconductor, an amorphous oxide semiconductor, and a CAAC-OS, as appropriate. When the oxide semiconductor films $731a$ and $731b$ each have a stacked-layer structure part of which includes an amorphous oxide semiconductor, internal stress or external stress of the oxide semiconductor films $731a$ and $731b$ is relieved, fluctuation in transistor characteristics is reduced, and the reliability of the transistor can be further improved.

Each thickness of the oxide semiconductor films $731a$ and $731b$ is preferably larger than or equal to 1 nm and smaller than or equal to 100 nm, more preferably larger than or equal to 1 nm and smaller than or equal to 30 nm, still more preferably larger than or equal to 1 nm and smaller than or equal to 50 nm, further preferably larger than or equal to 3 nm and smaller than or equal to 20 nm.

The concentration of alkali metal or alkaline earth metal in each of the oxide semiconductor films $731a$ and $731b$ is preferably lower than or equal to $1\times10^{18}$ atoms/cm$^3$, more preferably lower than or equal to $2\times10^{16}$ atoms/cm$^3$. This is because, when alkali metal or alkaline earth metal is bonded to an oxide semiconductor, some of the alkali metal or the alkaline earth metal generates carriers and cause an increase in the off-state current of the transistor.

The oxide semiconductor films $731a$ and $731b$ may contain nitrogen at a concentration lower than or equal to $5\square10^{18}$ atoms/cm$^3$.

The oxide semiconductor films $731a$ and $731b$ can be formed by a sputtering method, a coating method, a printing method, a pulsed laser deposition method, or the like.

It is sufficient that the gate insulating film $732$ be formed to have a stacked-layer structure or a single-layer structure using any of a silicon oxide, a silicon oxynitride, a Ga—Zn-based metal oxide, an aluminum oxide, an aluminum oxynitride, a gallium oxide, a gallium oxynitride, an yttrium oxide, an yttrium oxynitride, a hafnium oxide, a hafnium oxynitride, and the like. The gate insulating film $732$ can be formed by a sputtering method or a CVD method.

The gate electrode $733a$ and the second electrodes $733b$ and $733c$ can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese or zirconium may be used. The gate electrode 733a may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 733a and the second electrodes 733b and 733c can also be formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added. It is also possible to have a stacked-layer structure formed using the above light-transmitting conductive material and the above metal element. The gate electrode 733a and the second electrodes 733b and 733c can be formed by using a formation method similar to that of the pair of electrodes 726a and 726b as appropriate.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of a metal nitride (such as InN or ZnN), or the like is preferred to be provided between the gate electrode 733a and the gate insulating film 732. These films each have a work function higher than or equal to 5 eV, preferably higher than or equal to 5.5 eV, which is higher than the electron affinity of an oxide semiconductor; thus, the threshold voltage of a transistor including the oxide semiconductor can be shifted in the positive direction. Accordingly, a switching element having what is called normally-off characteristics can be obtained. For example, in the case of using an In—Ga—Zn-based oxynitride semiconductor film, an In—Ga—Zn-based oxynitride semiconductor film having a higher nitrogen concentration than at least the oxide semiconductor films 731a and 731b, specifically, an In—Ga—Zn-based oxynitride semiconductor film having a nitrogen concentration higher than or equal to 7 at. % is used.

It is sufficient that the insulating film 727 be formed to have a single-layer structure or a stacked-layer structure using one or more of a silicon oxide, a silicon oxynitride, a silicon nitride oxide, a silicon nitride, an aluminum oxide, an aluminum oxynitride, an aluminum nitride oxide, an aluminum nitride, and the like.

An insulating film 728 is formed over the insulating film 727. Contact plugs 735a and 735d penetrating the insulating films 727 and 728 and the gate insulating film 732, and contact plugs 735b and 735c penetrating the insulating films 727 and 728 are formed. An insulating film 730 is formed over the insulating film 728 and the contact plugs 735a to 735d, and wirings 737a and 737b are embedded in the insulating film 730.

Figure 9B:
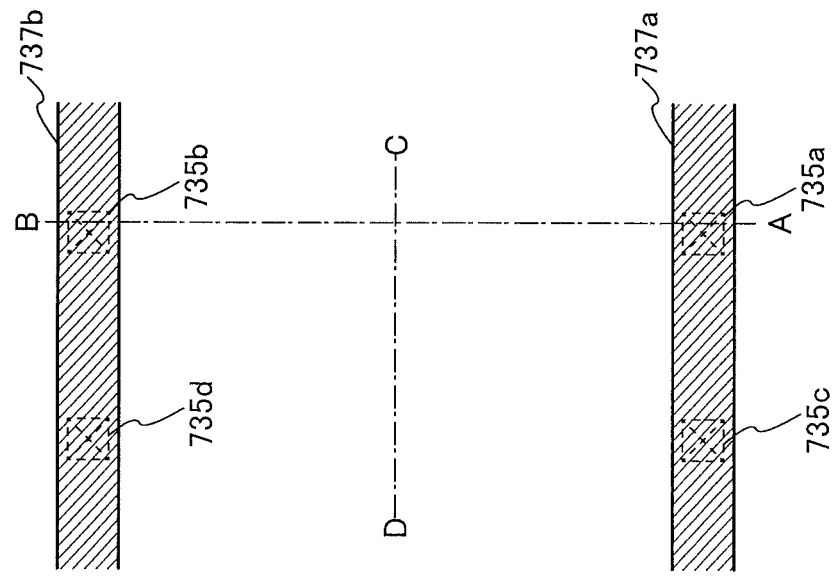
FIGS. 9A and 9B are top views illustrating a semiconductor device of one embodiment of the present invention.
Figure 9A:
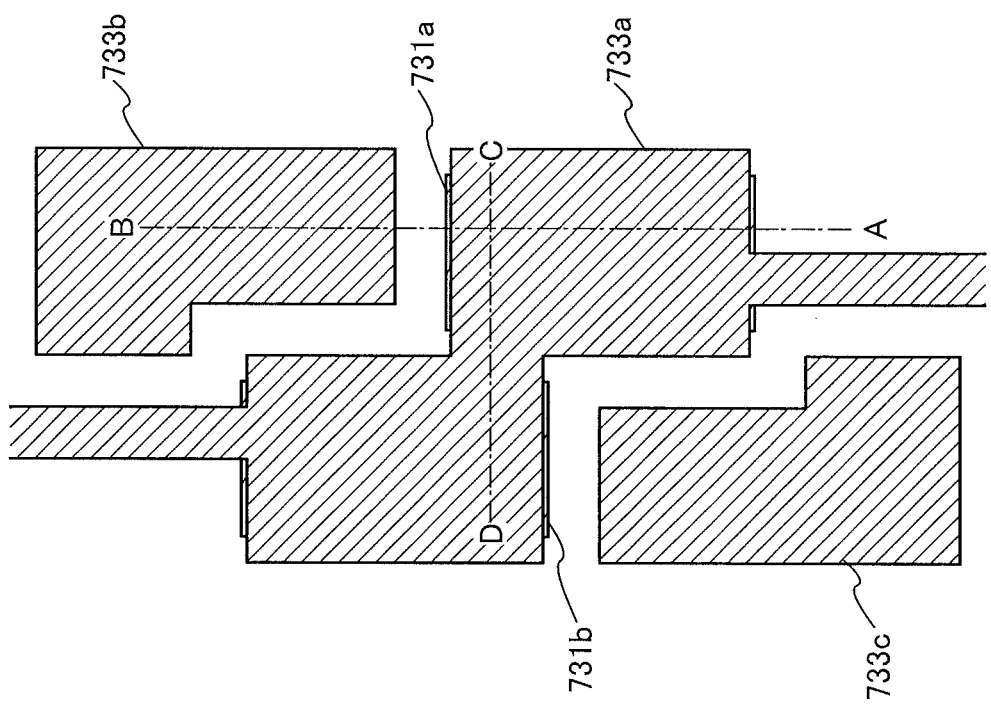
Figure 10A:
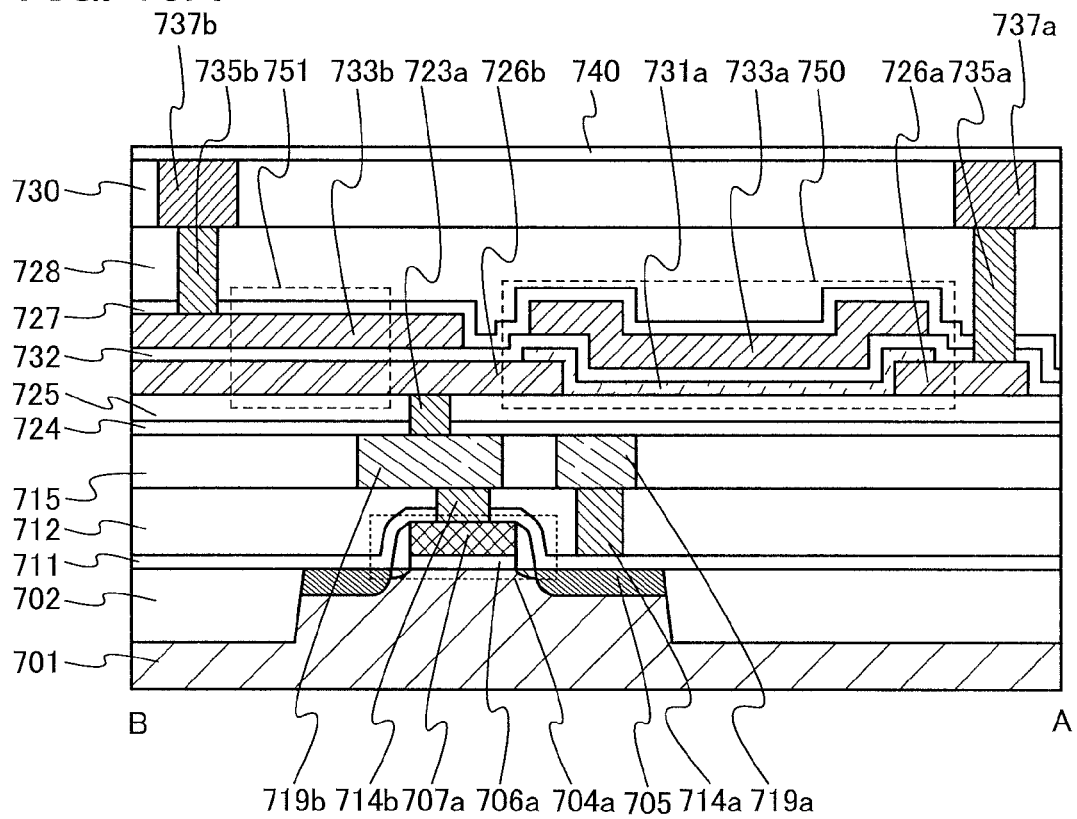
FIGS. 10A and 10B are cross-sectional views illustrating a semiconductor device of one embodiment of the present invention.

FIG. 9B is a top view of the contact plugs 735a to 735d and the wirings 737a and 737b.

The wiring 737a and the wiring 737b are connected to the terminal D and the terminal E shown in FIG. 1, respectively. The wiring 737a is connected to the transistor 750 through the contact plug 735a, and the wiring 737b is connected to the capacitor 751 through the contact plug 735b. The transistor 750 and the capacitor 751 are connected to each other through the electrode 726b.

Note that the insulating film 728 can be formed in a manner similar to that of the insulating film 712. The contact plugs 735a and 735b can be formed in a manner similar to that of the contact plugs 714a to 714d. The insulating film 730 can be formed in a manner similar to that of the insulating film 715. The wirings 737a and 737b can be formed in a manner similar to that of the wirings 719a to 719d.

A barrier film 740 is provided over the wirings 737a and 737b. The barrier film 740 can be formed in a manner similar to that of the barrier film 724.

Figure 10B:
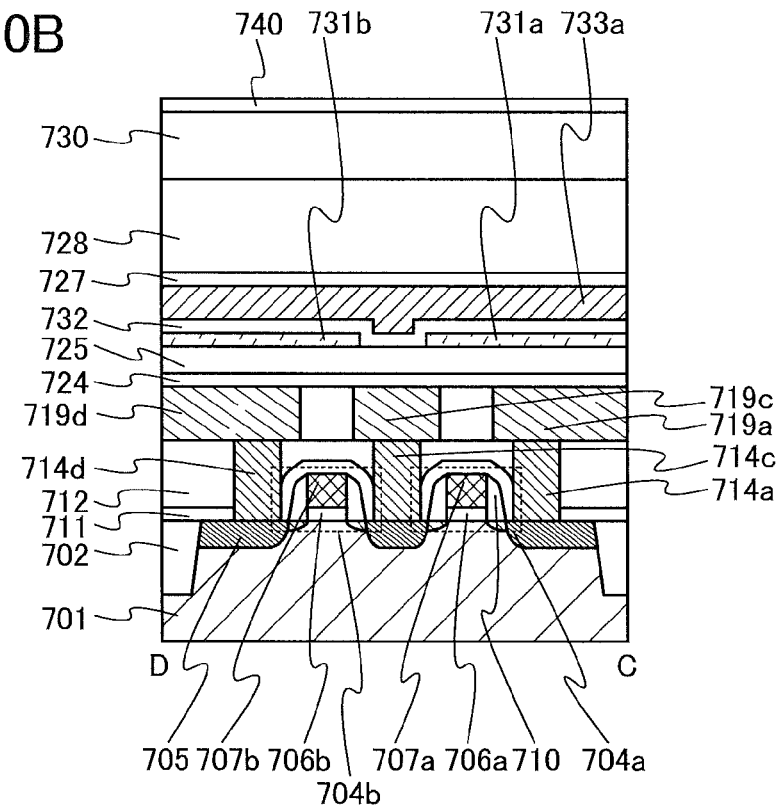

Note that for the transistor 750, a structure in which a pair of electrodes is provided between the oxide semiconductor film 731a and the gate insulating film 732 can be employed instead of the structure in FIGS. 10A and 10B.

In addition, although a top-gate structure is employed for the transistor 750 illustrated in FIG. 10A, a bottom-gate structure can be employed as appropriate. A transistor having a bottom-gate structure is described with reference to FIG. 11.

Figure 11:
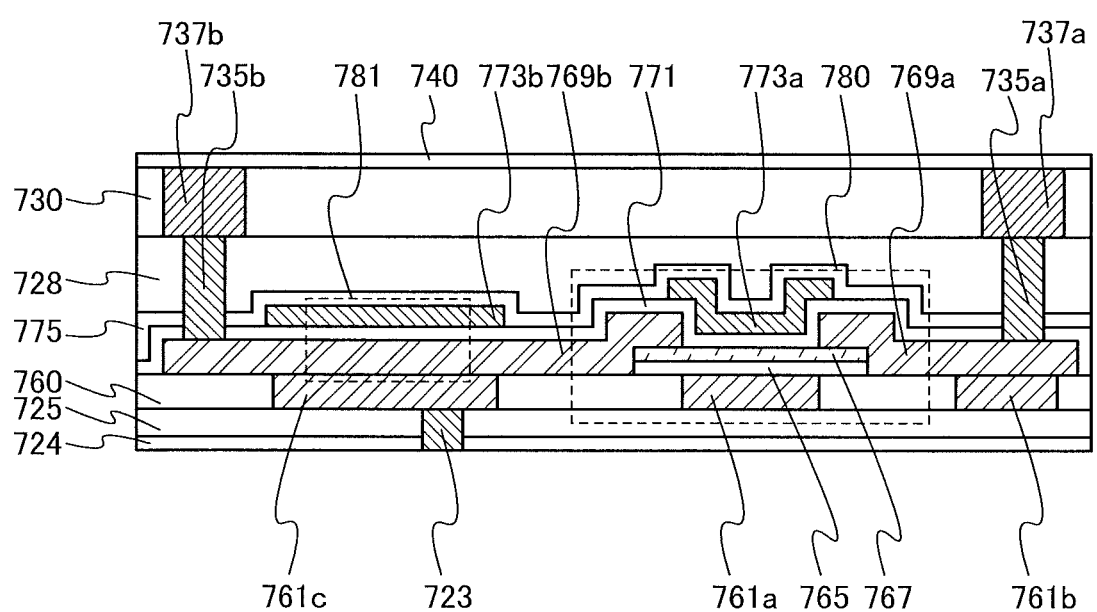
FIG. 11 is a cross-sectional view illustrating a semiconductor device of one embodiment of the present invention.

FIG. 11 illustrates another embodiment of the selection circuit illustrated in FIGS. 10A and 10B in portions from the barrier film 724 to the barrier film 740.

The insulating film 725 is formed over the barrier film 724. Moreover, a contact plug 723 is embedded in the barrier film 724 and the insulating film 725.

A transistor 780 and a capacitor 781 are formed over the insulating film 725.

The transistor 780 includes a first gate electrode 761a over the insulating film 725, a first gate insulating film 765 over the first gate electrode 761a, an oxide semiconductor film 767 over the first gate insulating film 765, a pair of electrodes 769a and 769b in contact with the oxide semiconductor film 767, a second gate insulating film 771 over the oxide semiconductor film 767 and the pair of electrodes 769a and 769b, and a second gate electrode 773a overlapping with the oxide semiconductor film 767 with the second gate insulating film 771 provided therebetween. Moreover, an insulating film 775 covering the second gate insulating film 771 and the second gate electrode 773a is included.

An insulating film 760 is formed over the insulating film 725. The first gate electrode 761a and wirings 761b and 761c are embedded in the insulating film 760. The wiring 761b and the wiring 761c are in contact with the electrode 769a and the electrode 769b, respectively.

The capacitor 781 includes the electrode 769b functioning as a first electrode, which is formed over the insulating film 760 and the wiring 761c, the second gate insulating film 771, and a second electrode 773b.

The transistor 780 is connected to the wiring 737a through the contact plug 735a. The capacitor 781 is connected to the wiring 737b through the contact plug 735b. The transistor 780 and the capacitor 781 are connected to each other through the electrode 769b.

The first gate electrode 761a and the wirings 761b and 761c can be formed in a manner similar to that of the gate electrode 733a in FIGS. 10A and 10B.

The first gate insulating film 765 and the oxide semiconductor film 767 can be formed in a manner similar to that of the gate insulating film 732 and the oxide semiconductor films 731a and 731b in FIGS. 10A and 10B, respectively.

The pair of electrodes 769a and 769b can be formed in a manner similar to that of the pair of electrodes 726a and 726b in FIG. 10A.

The second gate insulating film 771 can be formed in a manner similar to that of the gate insulating film 732 in FIGS. 10A and 10B.

The second gate electrode 773a and the second electrode 773b can be formed in a manner similar to that of the gate electrode 733a in FIGS. 10A and 10B.

The insulating film 775 can be formed in a manner similar to that of the insulating film 727 in FIGS. 10A and 10B.

The transistor 780 of this embodiment has the first gate electrode 761a and the second gate electrode 773a facing each other with the oxide semiconductor film 767, the first gate insulating film 765, and the second gate insulating film 771 provided therebetween. By application of different potentials to the first gate electrode 761a and the second gate electrode 773a, the threshold voltage of the transistor 780 can be controlled, and in a preferable manner, the negative shift in the threshold voltage can be suppressed. Alternatively, when the same potential is applied to the first gate electrode 761a and the second gate electrode 773a, the on-state current of the transistor 780 can be increased.

Note that for the transistor 780, a structure in which a pair of electrodes is provided between the oxide semiconductor film 767 and the first gate insulating film 765 can be employed instead of the structure in FIG. 11.

Although the transistor 780 includes the first gate electrode 761a and the second gate electrode 773a, a transistor including only the first gate electrode 761a may be used.

As described above, a semiconductor device including the selection circuit can be fabricated.

Such a semiconductor device is not limited to the above structure and can be changed as desired unless it deviates from the spirit of the present invention. For example, although one layer including the wirings, which is provided between the transistor 750 and the transistor 704a and 704b, is provided in FIGS. 10A and 10B, the number of the layers including the wirings can be two or more. Alternatively, elements can be directly connected to each other only by a contact plug without a wiring. In that case, a through-silicon via (TSV) technique can also be used, for example. In addition, although a material such as copper is embedded in an insulating film to form a wiring in the above description, a wiring having a three-layer structure of, for example, a barrier film, a wiring material layer, and a barrier film may be obtained by patterning through a photolithography process.

This embodiment can be combined with any of the above embodiments as appropriate.

This application is based on Japanese Patent Application serial No. 2012-119633 filed with the Japan Patent Office on May 25, 2012, the entire contents of which are hereby incorporated by reference.

What is claimed is:

1. An electronic device comprising:
   a first transistor;
   a second transistor;
   a first capacitor;
   a second capacitor; and
   a multiplexer comprising a first control terminal and a second control terminal,
   wherein one of a source electrode and a drain electrode of the first transistor is connected to one of a source electrode and a drain electrode of the second transistor via the first capacitor,
   wherein the other of the source electrode and the drain electrode of the first transistor is connected to the other of the source electrode and the drain electrode of the second transistor via the second capacitor,
   wherein the one of the source electrode and the drain electrode of the first transistor is connected to the first control terminal, and
   wherein the other of the source electrode and the drain electrode of the second transistor is connected to the second control terminal.

2. The electronic device according to claim 1,
   wherein the multiplexer further comprises a first input terminal, a second input terminal and an output terminal, and
   wherein it is configured that the output terminal and either one of the first input terminal and the second input terminal are conductive in accordance with both of a potential of the first control terminal and a potential of the second control terminal.

3. The electronic device according to claim 1, wherein a gate electrode of the first transistor and a gate electrode of the second transistor are connected with a line.

4. The electronic device according to claim 1,
   wherein the first control terminal is electrically floating when the first transistor is off, and
   wherein the second control terminal is electrically floating when the second transistor is off.

5. A driving method for the electronic device according to claim 1, comprising:
   when the first transistor and the second transistor are on, applying
     (a) a first potential to the other of the source electrode and the drain electrode of the first transistor and a second potential to the one of the source electrode and the drain electrode of the second transistor, or
     (b) a third potential to the other of the source electrode and the drain electrode of the first transistor and a fourth potential to the one of the source electrode and the drain electrode of the second transistor; and
   turning off the first transistor and the second transistor, followed by applying the first potential to the other of the source electrode and the drain electrode of the first transistor and the fourth potential to the one of the source electrode and the drain electrode of the second transistor when the first transistor and the second transistor are off,
   wherein the first potential is higher than the third potential, and
   wherein the fourth potential is higher than the second potential.

6. The driving method according to claim 5,
   wherein the first potential is equal to the fourth potential, and
   wherein the second potential is equal to the third potential.

7. The driving method according to claim 5,
   wherein the multiplexer further comprises a first input terminal, a second input terminal and an output terminal, and
   wherein it is configured that, when the first transistor and the second transistor are on, potentials of the output terminal, the first input terminal and the second input terminal are equal.

8. An electronic device comprising:
a first terminal;
a second terminal;
a first transistor;
a second transistor;
a first capacitor;
a second capacitor; and
a multiplexer comprising a first control terminal and a second control terminal,
wherein the first terminal is connected to the first capacitor and the first control terminal via the first transistor,
wherein the second terminal is connected to the second capacitor and the second control terminal via the second transistor,
wherein the first control terminal is connected to the second terminal via the first capacitor,
wherein the second control terminal is connected to the first terminal via the second capacitor.

9. The electronic device according to claim 8,
wherein the multiplexer further comprises a first input terminal, a second input terminal and an output terminal, and
wherein it is configured that the output terminal and either one of the first input terminal and the second input terminal are conductive in accordance with both of a potential of the first control terminal and a potential of the second control terminal.

10. The electronic device according to claim 8, wherein a gate electrode of the first transistor and a gate electrode of the second transistor are connected with a line.

11. The electronic device according to claim 8,
wherein the first control terminal is electrically floating when the first transistor is off, and
wherein the second control terminal is electrically floating when the second transistor is off.

12. A driving method for the electronic device according to claim 8, comprising:
when the first transistor and the second transistor are on, applying
(a) a first potential to the first terminal and a second potential to the second terminal, or
(b) a third potential to the first terminal and a fourth potential to the second terminal; and
turning off the first transistor and the second transistor, followed by applying the first potential to the first terminal and the fourth potential to the second terminal when the first transistor and the second transistor are off,
wherein the first potential is higher than the third potential, and
wherein the fourth potential is higher than the second potential.

13. The driving method according to claim 12,
wherein the first potential is equal to the fourth potential, and
wherein the second potential is equal to the third potential.

14. The driving method according to claim 12,
wherein the multiplexer further comprises a first input terminal, a second input terminal and an output terminal, and
wherein it is configured that, when the first transistor and the second transistor are on, potentials of the output terminal, the first input terminal and the second input terminal are equal.

* * * * *